US008189138B2

(12) United States Patent
Amimori et al.

(10) Patent No.: US 8,189,138 B2
(45) Date of Patent: May 29, 2012

(54) TRANSFER MATERIAL, PROCESS FOR PRODUCING A COLOR FILTER USING THE SAME, A COLOR FILTER AND LIQUID CRYSTAL DISPLAY DEVICE

(75) Inventors: Ichiro Amimori, Minami-ashigara (JP); Hideki Kaneiwa, Minami-ashigara (JP); Hidetoshi Tomita, Minami-ashigara (JP)

(73) Assignee: FUJIFILM Corporation, Minato-Ku, Tokyo (JP)

( * ) Notice: Subject to any disclaimer, the term of this patent is extended or adjusted under 35 U.S.C. 154(b) by 733 days.

(21) Appl. No.: 12/064,855

(22) PCT Filed: Sep. 8, 2006

(86) PCT No.: PCT/JP2006/318320
§ 371 (c)(1),
(2), (4) Date: Feb. 26, 2008

(87) PCT Pub. No.: WO2007/029885
PCT Pub. Date: Mar. 15, 2007

(65) Prior Publication Data
US 2009/0290102 A1 Nov. 26, 2009

(30) Foreign Application Priority Data
Sep. 8, 2005 (JP) .................. 2005-260340

(51) Int. Cl.
*G02F 1/1333* (2006.01)
(52) U.S. Cl. .......................... 349/93; 349/106
(58) Field of Classification Search ............... 349/93
See application file for complete search history.

(56) References Cited

U.S. PATENT DOCUMENTS
6,380,996 B1 4/2002 Yokoyama et al.
6,519,017 B1 2/2003 Ichihashi et al.
2002/0055555 A1 5/2002 Kuntz et al.
(Continued)

FOREIGN PATENT DOCUMENTS
EP 0 864 885 A1 9/1998
(Continued)

OTHER PUBLICATIONS

Notification Concerning Transmittal of International Preliminary Report on Patentability (IPRP) (Form PCT/IB/326), International Preliminary Report on Patentability (Form PCT/IB/373), Written Opinion of the International Searching Authority (Form PCT/ISA/237).

(Continued)

*Primary Examiner* — Jerry Rahll
(74) *Attorney, Agent, or Firm* — Buchanan Ingersoll & Rooney PC

(57) ABSTRACT

A transfer material comprising at least one optically anisotropic layer and at least one photosensitive polymer layer on at least one support, wherein said optically anisotropic layer comprises one or more compounds having a reactive group, and said photosensitive polymer layer comprises two or more types of photopolymerization initiators having different photoreaction mechanisms to each other, and a compound having a reactive group which can react with one or more of the reactive groups present in the optically anisotropic layer by the action of the at least one of said photopolymerization initiators. By using the transfer material, a color filter which contributes to reducing viewing angle dependence of color of a liquid crystal display device, and a liquid crystal display device having less corner non-uniformities and less viewing angle dependence of color.

19 Claims, 3 Drawing Sheets

U.S. PATENT DOCUMENTS

2003/0031845 A1  2/2003  Umeya et al.

FOREIGN PATENT DOCUMENTS

| | | |
|---|---|---|
| EP | 1 134 270 A1 | 9/2001 |
| EP | 1 300 701 A1 | 4/2003 |
| GB | 2 394 718 A | 5/2004 |
| JP | H10-278123 A | 10/1998 |
| JP | 2001-083694 A | 3/2001 |
| JP | 2002-196144 A | 7/2002 |
| JP | 2004-037837 A | 2/2004 |
| JP | 2005-024919 A | 1/2005 |
| JP | 2005-202093 A | 7/2005 |
| JP | 2006-276543 A | 10/2006 |
| JP | 2007-121986 A | 5/2007 |
| WO | WO 2006/104252 A2 | 10/2006 |

OTHER PUBLICATIONS

Form PCT/ISA/210 (International Search Report) dated Feb. 1, 2007.
Form PCT/ISA/237 (Written Opinion of the International Searching Authority) dated Feb. 1, 2007.
Office Action (Notice of Rejection) dated Sep. 7, 2010, issued in Japanese Patent Application No. 2005-260340, and English translation thereof.

TRANSFER MATERIAL, PROCESS FOR PRODUCING A COLOR FILTER USING THE SAME, A COLOR FILTER AND LIQUID CRYSTAL DISPLAY DEVICE

TECHNICAL FIELD

The present invention relates to a transfer material useful for producing a color filter having an optically anisotropic layer, and a liquid crystal display device. The present invention particularly relates to a transfer material useful for producing a color filter which can be used for a liquid crystal display device to reduce viewing angle dependence of color, and a liquid crystal display device using the same.

RELATED ART

A CRT (cathode ray tube) has been mainly employed in various display devices used for office automation (OA) equipment such as a word processor, a notebook-sized personal computer and a personal computer monitor, mobile phone terminal and television set. In recent years, a liquid crystal display device has more widely been used in place of a CRT, because of its thinness, lightweight and low power consumption. A liquid crystal display device usually comprises a liquid crystal cell and polarizing plates. The polarizing plate usually has protective films and a polarizing film, and is obtained typically by dying a polarizing film composed of a polyvinyl alcohol film with iodine, stretching the film, and laminating the film with the protective films on both surfaces. A transmissive liquid crystal display device usually comprises polarizing plates on both sides of a liquid crystal cell, and occasionally comprises one or more optical compensation films. A reflective liquid crystal display device usually comprises a reflector plate, a liquid crystal cell, one or more optical compensation films, and a polarizing plate in this order. A liquid crystal cell comprises liquid-crystalline molecules, two substrates encapsulating the liquid-crystalline molecules, and electrode layers applying voltage to the liquid-crystalline molecules. The liquid crystal cell switches ON and OFF displays depending on variation in orientation state of the liquid-crystalline molecules, and is applicable both to transmission type and reflective type, of which display modes ever proposed include TN (twisted nematic), IPS (in-plane switching), OCB (optically compensatory bend) and VA (vertically aligned) ECB (electrically controlled birefringence), and STN (super twisted nematic). Color and contrast displayed by the conventional liquid crystal display device, however, vary depending on the viewing angle. Therefore, it cannot be said that the viewing angle characteristics of the liquid crystal display device is superior to those of the CRT.

In order to improve the viewing angle characteristics, retardation plates for viewing-angle optical compensation, or, in other words, optical compensation sheets, have been used. There have been proposed various LCDs, employing a mode and an optical compensation sheet having an appropriate optical property for the mode, excellent in contrast characteristics without dependency on viewing angles. An OCB, VA or IPS modes are known as a wide-viewing mode, and LCDs employing such a mode can give a good contrast characteristic in all around view, and, then, become widely used as a home screen such as TV. Further, in recent years, a wide screen of over 30 inches has been also proposed.

Wide-screen LCDs suffer from light leakages from the corner portions, or, in other words, corner non-uniformities. It is considered that such phenomenon is caused by dimensional changes in the polarizer plates, which are employed in the LCDs, depending on environmental moisture. In particular for the case where a polarizer plate and an optical compensation sheet are bonded directly or bonded with an adhesive layer disposed between them, change of the optical characteristics of the optical compensation sheet, which significantly changes its retardation with dimensional changes in the polarizer plate, may worsen the corner non-uniformity.

An optical compensation sheet can effectively contribute to reducing viewing angle dependence of contrast, but cannot contribute to reducing viewing angle dependence of color sufficiently, and reducing viewing angle dependence of color is considered as an important problem to be solved for LCD. Viewing angle dependence of color of LCD is ascribable to difference in wavelength of three representative colors of R, G and B, so that even R, G and B lights go through are given equal retardation, the changes in polarization states of R, G and B lights brought about by the retardation are different each other. In view of optimizing this, it is necessary to optimize wavelength dispersion of birefringence of an optically anisotropic material with respect to the wavelengths of R, G and B. The LCD is, however, still on the way to thorough improvement in viewing angle characteristics of color, because it is still not easy to control the wavelength dispersion of birefringence of liquid crystal molecules used for ON/OFF display, or for optical compensation sheet.

There has been proposed a retardation plate using a modified polycarbonate, as an optical compensation sheet controlled in the wavelength dispersion of birefringence for reducing viewing angle dependence of color (Japanese Laid-Open Patent Publication "Tokkai" No. 2004-37837). Viewing angle dependence of color can be reduced by using this plate as a $\lambda/4$ plate for reflection-type liquid crystal display device, or as a compensation sheet for VA-mode device. It has, however, not been widely used yet for LCD, not only because the modified polycarbonate film is expensive, but also because the film tends to cause non-uniformity in the optical characteristics such as bowing during stretching included in the process of producing them.

On the other hand, based on the same principle as that of the viewing-angle compensation of contrast using the optical compensation sheet, a system has been also proposed which compensates the wavelength dispersion independently for each of three colors of R, G and B (GB2394718). The optical compensation is achieved mainly by patterning of a retardation plate together with a color filter or the like inside of a liquid crystal cell. However, it was difficult to form an optically anisotropic layer having a uniform retardation characteristic inside of a liquid crystal cell by using a patternable material.

SUMMARY OF THE INVENTION

An object of the present invention is to provide a transfer material useful for forming an optically anisotropic layer inside of a liquid crystal cell. Another object of the present invention is to provide a transfer material useful for forming a color filter with an optically anisotropic layer having an optically compensating ability inside of a liquid crystal cell. Further object of the present invention is to provide a transfer material for easy production of a liquid crystal cell substrate which contributes to reducing viewing angle dependence of color of a liquid crystal display device. Still further object of the present invention is to provide a liquid crystal display device (LCD) comprising a liquid crystal cell optically compensated therein in an exact manner, being excellent in the productivity, and having less viewing angle dependence of color and reduced corner non-uniformities.

The present invention thus provides the following 1 to 20.

1. A transfer material comprising at least one optically anisotropic layer and at least one photosensitive polymer layer on at least one support,
wherein said optically anisotropic layer comprises one or more compounds having a reactive group,
and said photosensitive polymer layer comprises two or more types of photopolymerization initiators having different photoreaction mechanisms to each other, and a compound having a reactive group which can react with one or more of the reactive groups present in the optically anisotropic layer by the action of at least one of said photopolymerization initiators.

2. The transfer material according to the above 1, wherein the optically anisotropic layer is a layer formed by coating with a solution comprising a liquid crystalline compound having a reactive group, and drying of the solution to thereby form a liquid crystal phase, and then applying heat or irradiating ionized radiation to the liquid crystal phase.

3. The transfer material according to the above 2, wherein the ionized radiation is polarized ultraviolet radiation.

4. The transfer material according to the above 2 or 3, wherein the liquid crystalline compound having a reactive group is a compound having an ethylenic unsaturated group.

5. The transfer material according to any one of the above 2 to 4, wherein the liquid crystalline compound is a rod-like liquid crystalline compound.

6. The transfer material according to any one of the above 2 to 5, wherein the liquid crystal phase is a cholesteric phase.

7. The transfer material according to any one of the above 1 to 6, wherein the optically anisotropic layer is formed of a composition comprising a radical polymerization initiator.

8. The transfer material according to any one of the above 1 to 7 wherein at least one of the photopolymerization initiators is a radical polymerization initiator.

9. The transfer material according to any one of the above 1 to B wherein at least one of the photopolymerization initiators is a cationic polymerization initiator.

10. The transfer material according to any one of the above 1 to 9, wherein the optically anisotropic layer comprises one or more of compounds having one or more groups selected from a group consisting of carboxy, hydroxy, amino, and thiol, and the photosensitive polymer layer comprises one or more compounds having epoxy group.

11. The transfer material according to any one of the above 1 to 10, wherein the optically anisotropic layer comprises one or more of compounds having epoxy group, and the photosensitive polymer layer comprises one or more compounds having one or more groups selected from a group consisting of carboxy, hydroxy, amino, and thiol.

12. The transfer material according to any one of the above 1 to 11, wherein the optically anisotropic layer is formed directly on the support or directly on a rubbed surface of an alignment layer formed on the support.

13. The transfer material according to any one of the above 1 to 12, wherein a frontal retardation (Re) value of the optically anisotropic layer is not zero, and the optically anisotropic layer gives substantially equal retardation values for light of a wavelength λ nm coming respectively in a direction rotated by +40° and in a direction rotated by −40° with respect to a normal direction of a layer plane using an in-plane slow axis as a tilt axis (a rotation axis).

14. The transfer material according to any one of the above 1 to 13, wherein the optically anisotropic layer has a frontal retardation (Re) value of 60 to 200 nm, and gives a retardation of 50 to 250 nm when light of a wavelength λ nm coming in a direction rotated by +40° with respect to a normal direction of a layer plane using an in-plane slow axis as a tilt axis (a rotation axis).

15. The transfer material according to any one of the above 1 to 14, wherein the photosensitive polymer layer comprises a dye or a pigment.

16. A process for producing a liquid crystal cell substrate, which comprises the following steps [1] to [3] in this order:
[1] laminating the transfer material according to any one of the above 1 to 15 on a substrate;
[2] separating the support from the transfer material laminated on the substrate; and
[3] exposing the photosensitive polymer layer disposed on the substrate to light.

17. A process for producing a liquid crystal cell substrate, which comprises the following steps [1] to [4] in this order:
[1] laminating the transfer material according to any one of the above 1 to 15 on a substrate;
[2] separating the support from the transfer material laminated on the substrate; and
[3] exposing the photosensitive polymer layer disposed on the substrate to light; and
[4] removing unnecessary parts of the photosensitive polymer layer and the optically anisotropic layer on the substrate.

18. A liquid crystal cell substrate produced by the process according to the above 16 or 17.

19. A liquid crystal display device comprising the liquid crystal cell substrate according to the above 18.

20. The liquid crystal display device according to the above 19, employing a VA or IPS mode as a liquid crystal mode.

Figure 1:
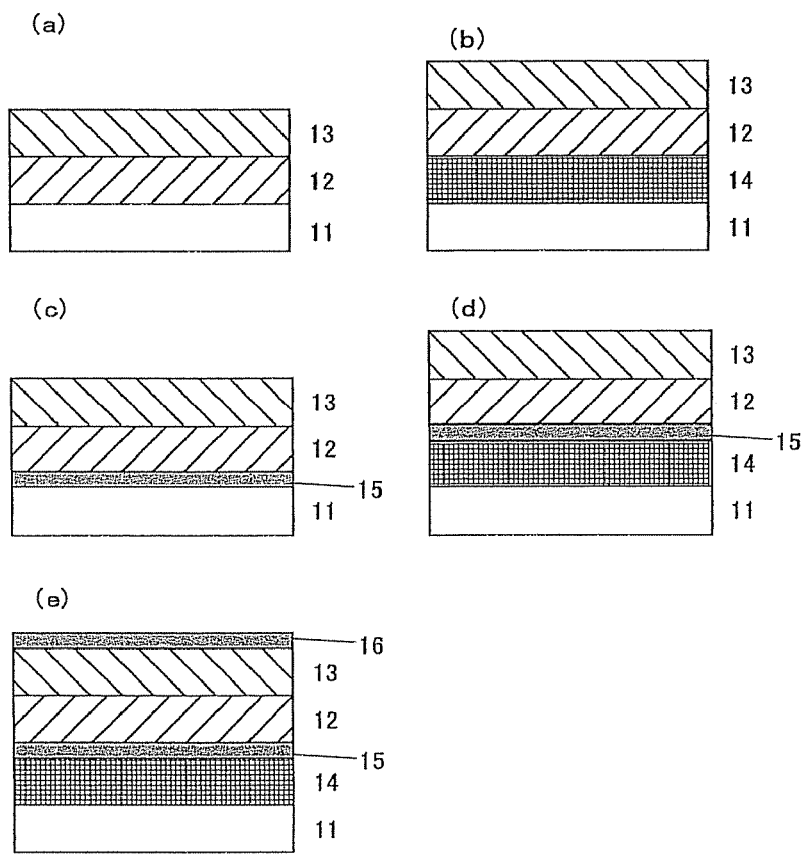
FIGS. 1(a) to 1(e) are schematic sectional views showing examples of the transfer material of the present invention.

Reference numerals used in the drawings represents the followings:

| | |
|---|---|
| 11 | temporary support; |
| 12 | optically anisotropic layer; |
| 13 | photosensitive polymer layer; |
| 14 | mechanical characteristic control layer; |
| 15 | alignment layer; |
| 16 | protective layer; |
| 21 | target substrate; |
| 22 | black matrix; |
| 23 | color filter layer; |
| 24 | non-patterned optically anisotropic layer; |
| 25 | transparent electrode layer; |
| 26 | alignment layer; |
| 31 | liquid crystal; |
| 32 | TFT; |
| 33 | polarizing layer; |
| 34 | cellulose acetate film (polarizer plate protective film); |
| 35 | cellulose acetate film, or optical compensation sheet; and |
| 37 | liquid crystal cell. |

DETAILED DESCRIPTION OF THE INVENTION

Paragraphs below will detail the present invention.

In the specification, ranges indicated with "to" mean ranges including the numerical values before and after "to" as the minimum and maximum values.

In this patent specification, retardation value Re is defined as being calculated based on the process below. $Re(\lambda)$ represents in-plane retardation at wavelength $\lambda$. $Re(\lambda)$ is measured according to the parallel Nicol method by allowing light of $\lambda$ nm to enter on the film in the normal direction. In this specification, $\lambda$ is 611±5 nm, 545±5 nm and 435±5 nm for R, G and B, respectively, and denotes 545±5 nm or 590±5 nm if no specific description is made on color.

It is to be noted that, regarding angles, the term "substantially" in the context of this specification means that a tolerance of less than ±5' with respect to the precise angles can be allowed. Difference from the precise angles is preferably less than 4°, and more preferably less than 3°. It is also to be noted that, regarding retardation values, the term "substantially" in the context of this specification means that a tolerance of less than ±5% with respect to the precise values can be allowed. It is also to be noted that the term "The Re value is not zero" in the context of this specification means that the Re value is not less than 5 nm. The measurement wavelength for refractive indexes is a visible light wavelength, unless otherwise specifically noted. It is also to be noted that the term "visible light" in the context of this specification means light of a wavelength falling within the range from 400 to 700 nm.

[Transfer Material]

The transfer material of the present invention comprises a support, at least one optically anisotropic layer and at least one photosensitive polymer layer, and is a material used for transferring the optically anisotropic layer and the photosensitive polymer layer onto other substrate. FIGS. 1(a) to 1(e) are schematic sectional views showing several examples of the transfer material of the present invention. The transfer material of the present invention shown in FIG. 1(a) comprises a transparent or opaque temporary support 11, and an optically anisotropic layer 12 and a photosensitive polymer layer 13 formed thereon. The transfer material of the present invention may comprise other layers, and may have, typically as shown in FIG. 1(b), a layer 14 for dynamic property control, such as cushioning for absorbing irregularity on the target substrate side, or for imparting conformity to such irregularity, provided between the support 11 and the optically anisotropic layer 12, or may comprise, typically as shown in FIG. 1(c), a layer 15 functioning as an alignment layer controlling orientation of the liquid crystalline molecules in the optically anisotropic layer 12, or may comprise, typically as shown in FIG. 1(d), both of these layers. Further, as shown in FIG. 1(e), a strippable protective layer 16 may be provided on the top surface, typically for the purpose of protection of a photosensitive polymer layer surface.

[Substrate for Liquid Crystal Display Device]

The optically anisotropic layer of the transfer material of the present invention may be transferred onto a substrate for liquid crystal display device, to constitute an optically anisotropic layer for optically compensating retardation of a liquid crystal cell. The optically anisotropic layer formed inside of the liquid crystal cell may optically compensate retardation of the liquid crystal cell in an independent manner or in combination with other optically anisotropic layer disposed outside the cell. When the photosensitive polymer layer is transferred together with the optically anisotropic layer onto a target transfer substrate such as a cell substrate, the photosensitive polymer layer has a function to allow the optically anisotropic layer to adhere to the target transfer substrate. The photosensitive polymer layer may also contribute to patterning the optically anisotropic layer with the difference in solubility between light-exposed parts and non-exposed parts thereof. By using the photosensitive polymer layer for formation of a color filter, optically anisotropic layers capable of optically compensating retardations of a liquid crystal cell for R, G and B respectively, can be formed. The substrate having such layers transferred thereon may be used for either one of a pair of substrates of a liquid crystal cell, or may be used for both in a divided manner.

Figure 2:
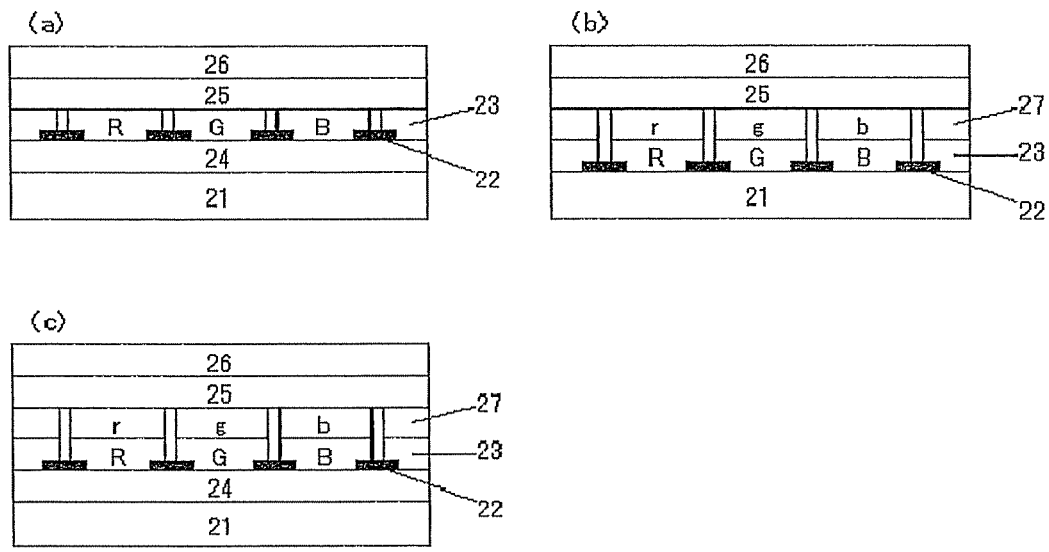
FIGS. 2(a) to 2(c) are schematic sectional views showing examples of the liquid crystal cell substrate of the present invention.

FIG. 2(a) shows a schematic sectional view showing an example of a substrate having an optically anisotropic layer, produced by using the transfer material of the present invention. The target substrate 21 is not specifically limited so far as it is transparent, but is preferably a support having a small birefringence. A support comprising glass, small-birefringent polymer, or the like can be used. On the substrate, there is provided an optically anisotropic layer 24 formed by using the transfer material of the present invention, and further thereon, a black matrix 22 and a color filter layer 23 are formed. Although not illustrated in FIG. 2(a), there is disposed, between the optically anisotropic layer 24 and the substrate 21, a photosensitive polymer layer which is a constituent layer of the transfer material, having a function of adhering the optically anisotropic layer 24 and the substrate 21. Further on the color filter layer 23, there are formed a transparent electrode layer 25, and still further thereon, there is formed an alignment layer 26 aligning the liquid crystal molecules in the liquid crystal cell. After the optically anisotropic layer 24 is formed on the substrate 21 using the transfer material of the present invention, the black matrix 22 and the color filter layer 23 may be formed by a method of coating a resist material and thereafter by removing the unnecessary portion thereof by light exposure through a mask and development, or may be formed by using the recently proposed printing system or ink jet system. The latter is more preferable in terms of cost.

FIG. 2(b) is a schematic sectional view showing an example of a substrate of the present invention, having a color filter provided with an optically anisotropic layer, produced by using the transfer material of the present invention. The target substrate 21 is not specifically limited so far as it is transparent, but is preferably a support having a small birefringence. A support comprising glass, small-birefringent polymer, or the like can be used. The target substrate generally has the black matrix 22 formed thereon, and further thereon, there are formed the color filter layer 23 composed of the photosensitive polymer layer and the optically anisotropic layer 27, which are transferred from the transfer material of the present invention, and patterned by light exposure through a mask. The optically anisotropic layer 27 is divided into r, g and b regions, and has optimum retardation characteristics optimized for each of the filter layers 23 of R, G and B. Any other layers transferred from the transfer material may reside on the optically anisotropic layer 27, but such layers are preferably removed during development and cleaning for the patterning, because impurity contamination in the liquid crystal cell should be avoided as possible. On the optically anisotropic layer 27, there is formed the transparent electrode layer 25, and further thereon, there is formed an alignment layer 26 aligning the liquid crystal molecules in the liquid crystal cell.

As shown in FIG. 2(c), two layers may be provided on a single target substrate, one of which is the non-patterned optically anisotropic layer 24 and the other is the patterned optically anisotropic layer 27 formed using the transfer material of the present invention. The non-patterned optically anisotropic layer may be the one formed by using the transfer material of the present invention, or may be the one formed by any other methods. Also, materials for composing the non-patterned optically anisotropic layer are not specifically limited. Although not illustrated, the non-patterned optically anisotropic layer 24 may be formed on one of a pair of opposed substrates of the liquid crystal cell, and at the same time the patterned optically anisotropic layer 27 may be formed together with the color filter layers 23 on the other substrate. One of the pair of opposing substrates often has a drive electrode such as a TFT array disposed thereon. On the drive electrode, a non-patterned optically anisotropic layer 24, or a patterned optically anisotropic layer 27 together with color filter layers 23, may be formed. Either optically anisotropic layer may be formed anywhere on the substrate. However, in an active-matrix-type device having the TFT, an optically anisotropic layer is preferably formed in an upper layer of silicon layer, considering heat resistance of the optically anisotropic layer.

Use of the transfer material of the present invention makes it possible to simultaneously form the color filter of one color and the correspondent optically anisotropic layer by one routine of transfer/light-exposure/development, and to produce a color filter substrate, which can contribute to improving the viewing angle characteristics of liquid crystal display device, according to a process including the same number of steps as in the process for producing a color filter described in Japanese Laid-Open Patent Publication "Tokkaihei" No. 3-282404.

It is to be noted that FIGS. 2(a) to 2(c) showed the embodiments comprising R, G and B color filter layers 23 formed therein, whereas it is also allowable to form color filter layers composed of R, G, B and W (white), as is frequently used recently.

[Liquid Crystal Display Device]

Figure 3:
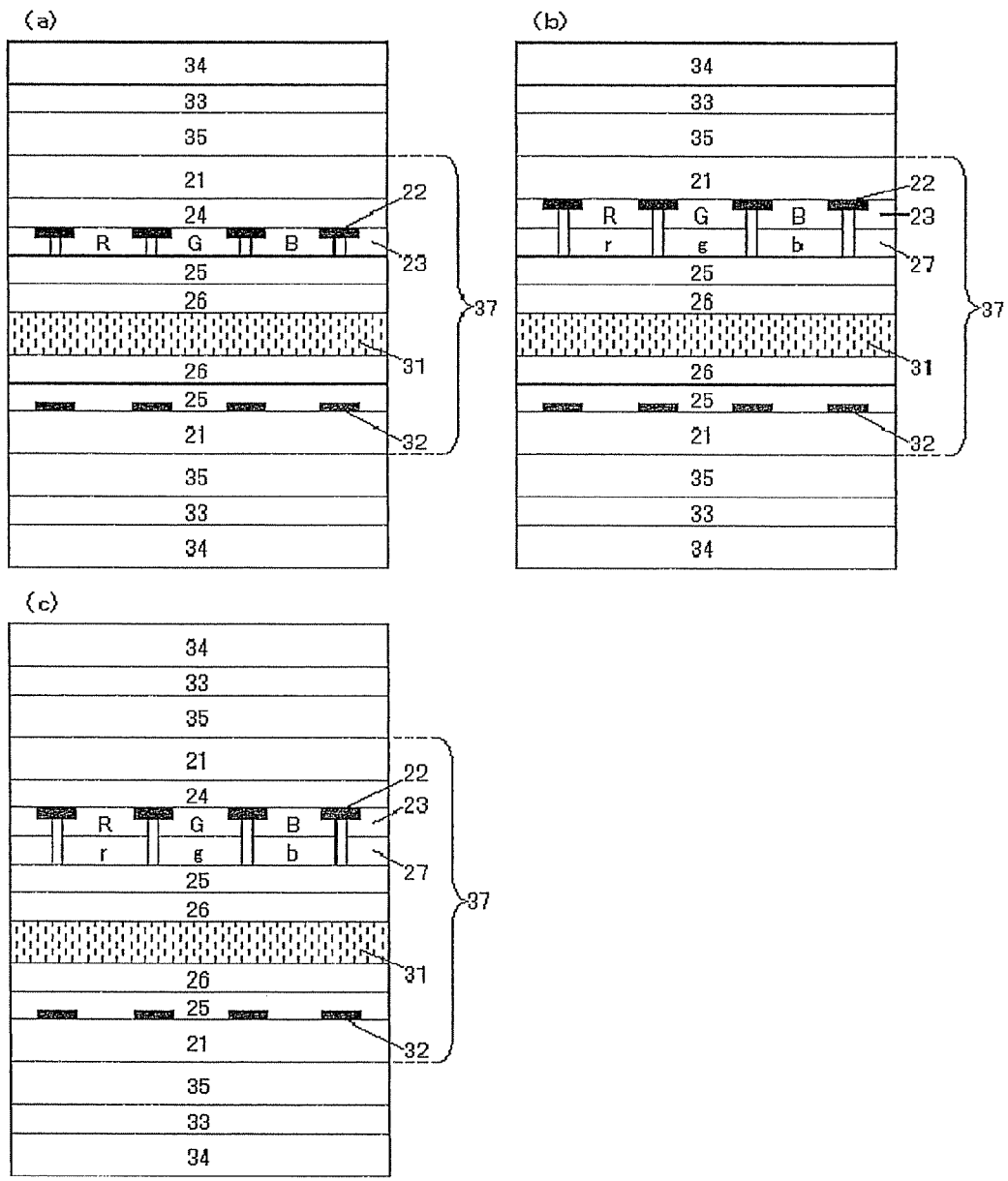
FIGS. 3(a) to 3(c) are schematic sectional views showing examples of the liquid crystal display device of the present invention.

FIGS. 3(a) to 3(c) are schematic sectional views showing examples of the liquid crystal display device of the present invention. FIGS. 3(a) to 3(c) exemplify the liquid crystal display devices using the liquid crystal cells 37 respectively configured by using the glass substrates shown in FIGS. 2(a) to 2(c) as the upper substrates, using the substrates with TFTs 32 as the opposing substrates, and holding the liquid crystal in between. Respectively on both sides of each liquid crystal cell 37, there is disposed a polarizer plate 36 configured by two cellulose ester (TAC) films 34, 35 and a polarizing layer 33 held in between. The cellulose ester film 35 on the liquid crystal cell side may be used as the optical compensation sheet, or may be same as the cellulose ester film 34. Although not illustrated, an embodiment of a reflection-type liquid crystal display device needs only one polarizer plate disposed on the observer's side, and a reflection film is disposed on the back surface of the liquid crystal cell or on the inner surface of the lower substrate. Of course, a front light may be disposed on the observer's side of the liquid crystal cell. A semi-transmissive configuration, having both of a transmissive domain and a reflective domain in one pixel of the display device, is also allowable. Display mode of the liquid crystal display device is not specifically limited, and the present invention is applicable to any transmission-type and reflection-type liquid crystal display devices. Among them, the present invention is effective for VA-mode device for which reduction of viewing angle dependence of color is desired.

Next paragraphs will detail materials and methods which are useful for producing the transfer material of the present invention.

The transfer material of the present invention comprises a support, the above-described optically anisotropic layer, and the above-described photosensitive polymer layer. Application of the transfer material of the present invention is not specifically limited, wherein it is preferable to use it for producing members of liquid crystal display devices. In such embodiment, the optically anisotropic layer may contribute to optical compensation of the liquid crystal display device, that is, contribute to widening the viewing angle, ensuring desirable contrast and to cancel coloration of image on the liquid crystal display device. The photosensitive polymer layer also may function as an adhesion layer upon a transfer, and as a resist layer for patterning the optically anisotropic layer. The patterned resist layer may be used as a part of, or the entire portion of the color filter. By using the transfer material of the present invention, the optically anisotropic layer and the color filter composed of the photosensitive polymer layer can be transferred at the same time onto the glass substrate of the liquid crystal display device, and this consequently makes it possible to provide a color filter substrate which contributes to improving the viewing angle characteristics of the liquid crystal display device, in particular reducing viewing angle dependence of color, without hardly varying the number of process steps.

Paragraphs below will detail the present invention with respect to materials and processes used for the production. It is to be noted that the present invention is by no means limited to the embodiments below, and any other embodiments can be carried out referring to the description below and known methods, so that the present invention is not limited to the embodiment of the transfer material explained below.

[Support]

The support used in the transfer material of the present invention is not particularly limited and may be transparent or opaque. Polymer films may be used as a support. Examples of the polymer film, which can be used as a support, however not limited to them, include cellulose ester films such as cellulose acetate films, cellulose propionate films, cellulose butyrate films, cellulose acetate propionate films and cellulose acetate butyrate films; polyolefin films such as norbornene based polymer films, poly(meth)acrylate films such as polymethylmethacrylate films, polycarbonate films, polyester films and polysulfone films. For the purpose of property examination in a manufacturing process, the support is preferably selected from transparent and low-birefringence polymer films. Examples of the low-birefringence polymer films include cellulose ester films and norbornene based polymer films. Commercially available polymers (for example, as a norbornene based polymer, "ARTON" provided by JSR and "ZEONEX" and "ZEONOR"" provided by ZEON CORPORATION) may be used. Polycarbonate, poly(ethylene terephthalate), or the like which is inexpensive, may also be preferably used.

[Optically Anisotropic Layer]

The optically anisotropic layer included in the transfer material of the present invention is not specifically limited so far as the layer gives a retardation, which is not zero, for a light incoming in at least one direction, that is, the layer has an optical characteristic not understood as being isotropic. The layer is preferably formed by ultraviolet curing of a liquid crystal layer comprising at least one species of liquid crystalline compound, from the viewpoint that it is used in the liquid crystal cell, and that the optical characteristics can readily be controlled. The composition for forming the liquid crystal layer preferably comprises a radical polymerization initiator.

Further, the optically anisotropic layer in the transfer material of the present invention preferably comprises a compound having:

a reactive group which is activated (for example, a reactive group which starts a polymerization reaction) by the action of either or both of the two (or more) types of polymerization initiator added to the photosensitive polymer layer; or a reactive group which reacts with a reactive group which is present in the photosensitive polymer layer and activated by the action of either or both of the two (or more) types of polymerization initiator added to the photosensitive polymer layer. As the compound having a reactive group in the optically anisotropic layer in the transfer material of the present invention, a compound having a reactive group which is activated by the action of a cationic polymerization initiator is preferred, and a compound having one or more groups selected from a group consisting of epoxy, carboxy, hydroxy, amino, and thiol. The aforementioned compound having a reactive group preferably does not destroy the liquid crystalline property of the liquid crystalline compound forming the optically anisotropic layer, when the two compounds are mixed. The aforementioned compound having a reactive group per se may be the liquid crystalline compound. The aforementioned compound having a reactive group may also preferably have a two or more different reactive groups (for example, a radical-polymerization-reactive group which may have been used for fixing of the alignment of liquid crystalline molecules and a reactive group activated with a cationic polymerization initiator which is used for improving adhesion of the optically anisotropic layer and the photosensitive polymer layer) in one molecule. It is particularly preferred that one of the two reactive groups is an ethylenic unsaturated group and the other is any one of epoxy, carboxy, hydroxy, amino, and thiol. The amount of the compound having a reactive group added to the composition for forming the optically anisotropic layer is preferably in a range which does not destroy the liquid crystalline property of the liquid crystalline compound forming optically anisotropic layer, and generally the amount is preferably 0.1 to 50% by weight, more preferably 1.0 to 30% by weight based on the solid part of the coating liquid.

Examples of the compound having a reactive group comprised in the optically anisotropic layer include (meth)acrylic acid, glycidyl(meth)acrylate, (meth)acryloxyalkylalkoxy silane, hydroxyethyl(meth)acrylate, 2-hydroxy-3-phenoxypropyl(meth)acrylate, 2-acryloyloxyethylhexahydrophthalic acid, trimethyrolpropane ally ether and the like, and further, commercial monomers and oligomers such as DM-201, DM-811, and DM-851 (manufactured by Nagase ChemteX Cooperation).

[Optically Anisotropic Layer Formed of Composition Comprising Liquid Crystalline Compound]

The aforementioned optically anisotropic layer is preferably formed of a composition comprising at least one liquid crystalline compound. The optically anisotropic layer functions as an optically anisotropic layer compensating the viewing angle of a liquid crystal device, by being incorporated into the liquid crystal cell as described above. Not only an embodiment in which the optically anisotropic layer can independently exhibit a sufficient level of optical compensation property, but also an embodiment in which an optical characteristic necessary for the optical compensation is satisfied after being combined with other layer (for example, optically anisotropic layer disposed outside the liquid crystal cell) are within the scope of the present invention. The optically anisotropic layer included in the transfer material does not necessarily have an optical characteristic sufficient for satisfying the optical compensation property. Alternatively, the layer may exhibit an optical characteristic necessary for the optical compensation as a result, for example, of the exposure step carried out during a transfer process of the transfer material onto the liquid crystal cell substrate which generates or changes the optical characteristics of the layer.

The optically anisotropic layer is preferably formed of a composition comprising at least one liquid crystalline compound. The liquid-crystalline compounds can generally be classified by molecular geometry into rod-like one and discotic one. Each category further includes low-molecular type and high-molecular type. The high-molecular type generally refers to that having a degree of polymerization of 100 or above ("Kobunshi Butsuri-Soten'i Dainamikusu (Polymer Physics-Phase Transition Dynamics), by Masao Doi, p. 2, published by Iwanami Shoten, Publishers, 1992). Either type of the liquid-crystalline molecule may be used in the present invention, wherein it is preferable to use a rod-like liquid-crystalline compound or a discotic liquid-crystalline compound. A mixture of two or more rod-like liquid-crystalline compound, a mixture of two or more discotic liquid-crystalline compound, or a mixture of a rod-like liquid-crystalline compound and a discotic liquid-crystalline compound may also be used. It is more preferable that the optically anisotropic layer is formed using a composition comprising the rod-like liquid-crystalline compound or the discotic liquid-crystalline compound, having a reactive group, because such compound can reduce temperature- and moisture-dependent changes, and it is still further preferable that at least one compound in the mixture has two or more reactive group in a single liquid-crystalline molecule. The liquid-crystalline composition may be a mixture of two or more compounds, wherein at least one of the compounds preferably has two or more reactive groups. The thickness of the optically anisotropic layer is preferably 0.1 to 20 μm, and more preferably 0.5 to 10 μm.

Examples of the rod-like liquid-crystalline compound include azomethine compounds, azoxy compounds, cyanobiphenyl compounds, cyanophenyl esters, benzoate esters, cyclohexanecarboxylic acid phenyl esters, cyanophenylcyclohexane compounds, cyano-substituted phenylpyrimidine compounds, alkoxy-substituted phenylpyrimidine compounds, phenyldioxane compounds, tolan compounds and alkenylcyclohexylbenzonitrile compounds. Not only the low-molecular-weight, liquid-crystalline compound as listed in the above, high-molecular-weight, liquid-crystalline compound may also be used. High-molecular-weight liquid-crystalline compounds may be obtained by polymerizing low-molecular-weight liquid-crystalline compounds having at least one reactive group. Among such low-molecular-weight liquid-crystalline compounds, liquid-crystalline compounds represented by a formula (I) are preferred.

$Q^1$-$L^1$-$A^1$-$L^3$-M-$L^4$-$A^2$-$L^2$-$Q^2$            Formula (I)

In the formula, $Q^1$ and $Q^2$ respectively represent a reactive group. $L^1$, $L^2$, $L^3$ and $L^4$ respectively represent a single bond or a divalent linking group, and it is preferred that at least one of $L^3$ and $L^4$ represents —O—CO—O—. $A^1$ and $A^2$ respectively represent a $C_{2-20}$ spacer group. M represents a mesogen group.

In formula (I), $Q^1$ and $Q^2$ respectively represent a reactive group. The polymerization reaction of the reactive group is preferably addition polymerization (including ring opening polymerization) or condensation polymerization. In other words, the reactive group is preferably a functional group capable of addition polymerization reaction or condensation polymerization reaction. Examples of reactive groups are shown below.

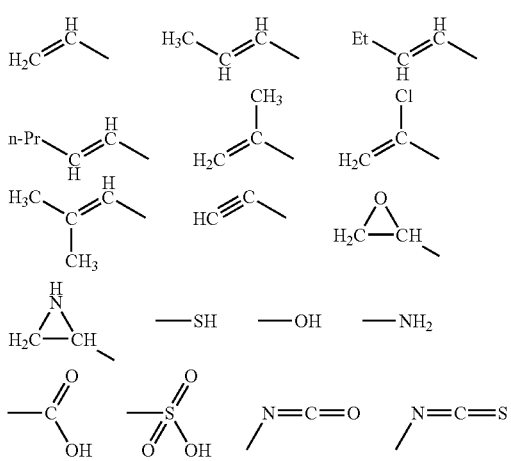

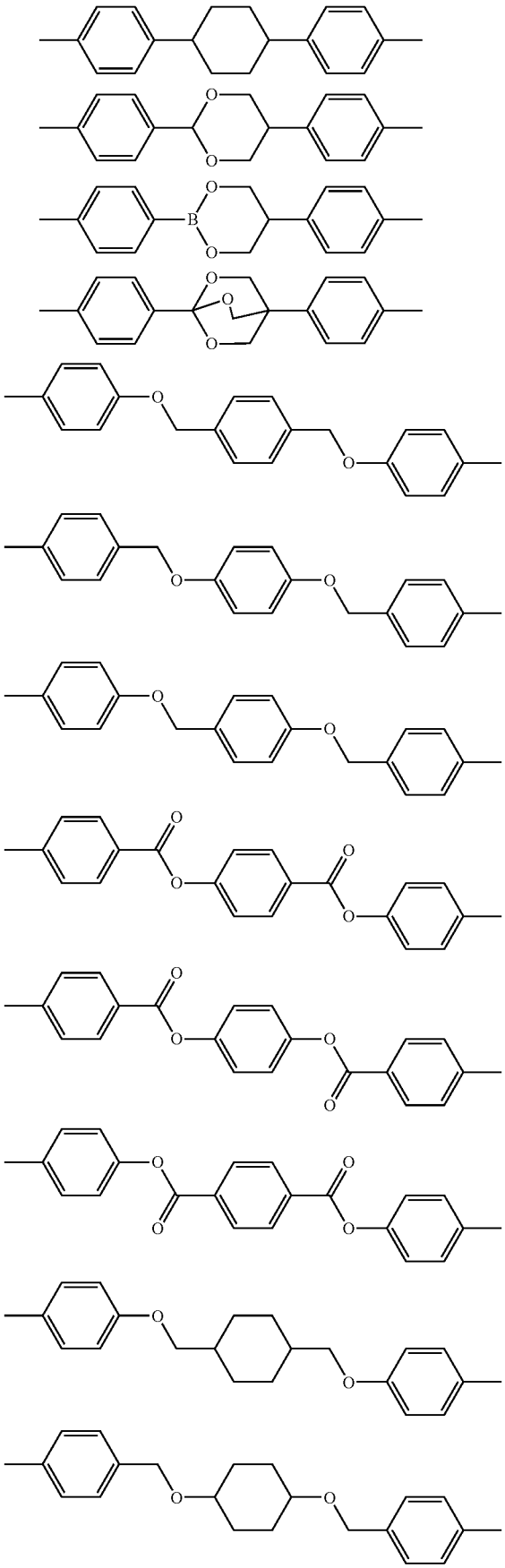

$L^1$, $L^2$, $L^3$ and $L^4$ independently represent a divalent linking group, and preferably represent a divalent linking group selected from the group consisting of —O—, —S—, —CO—, —NR$^2$—, —CO—O—, —O—CO—O—, —CO—NR$^2$—, —NR$^2$—CO—, —O—CO—, —O—CO—NR$^2$—, —NR$^2$—CO—O— and —NR$^2$—CO—NR$^2$—. $R^{12}$ represents a $C_{1-7}$ alkyl group or a hydrogen atom. It is preferred that at least one of $L^1$ and $L^4$ represents —O—CO—O— (carbonate group). It is preferred that $Q^1$-$L^1$ and $Q^2$-$L^2$- are respectively $CH_2$=CH—C—O—, $CH_2$=C($CH_3$)—CO—O— or $CH_2$=C(Cl)—CO—O—CO—O—; and it is more preferred they are respectively $CH_2$=CH—CO—O—.

In the formula, $A^1$ and $A^2$ preferably represent a $C_{2-20}$ spacer group. It is more preferred that they respectively represent $C_{2-12}$ aliphatic group, and much more preferred that they respectively represent a $C_{2-12}$ alkylene group. The spacer group is preferably selected from chain groups and may contain at least one unadjacent oxygen or sulfur atom. And the spacer group may have at least one substituent such as a halogen atom (fluorine, chlorine or bromine atom), cyano, methyl and ethyl.

Examples of the mesogen represented by M include any known mesogen groups. The mesogen groups represented by a formula (II) are preferred.

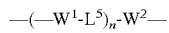 Formula (II)

In the formula, $W^1$ and $W^2$ respectively represent a divalent cyclic aliphatic group or a divalent hetero-cyclic group; and $L^5$ represents a single bond or a linking group. Examples of the linking group represented by $L^5$ include those exemplified as examples of $L^1$ to $L^4$ in the formula (I) and —$CH_2$—O— and —O—$CH_2$—In the formula, n is 1, 2 or 3.

Examples of $W^1$ and $W^2$ include 1,4-cyclohexanediyl, 1,4-phenylene, pyrimidine-2,5-diyl, pyridine-2,5-diyl, 1,3,4-thiazole-2,5-diyl, 1,3,4-oxadiazole-2,5-diyl, naphtalene-2,6-diyl, naphtalene-1,5-diyl, thiophen-2,5-diyl, pyridazine-3,6-diyl. 1,4-cyclohexanediyl has two stereoisomers, cis-trans isomers, and the trans isomer is preferred. $W^1$ and $W^2$ may respectively have at least one substituent. Examples the substituent include a halogen atom such as a fluorine, chlorine, bromine or iodine atom; cyano; a $C_{1-10}$ alkyl group such as methyl, ethyl and propyl; a $C_{1-10}$ alkoxy group such as methoxy and ethoxy; a $C_{1-10}$ acyl group such as formyl and acetyl; a $C_{2-10}$ alkoxycarbonyl group such as methoxy carbonyl and ethoxy carbonyl; a $C_{2-10}$ acyloxy group such as acetyloxy and propionyloxy; nitro, trifluoromethyl and difluoromethyl.

Preferred examples of the basic skeleton of the mesogen group represented by the formula (II) include, but not to be limited to, these described below. And the examples may have at least one substituent selected from the above.

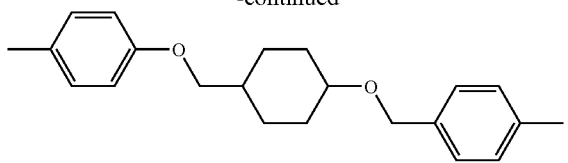
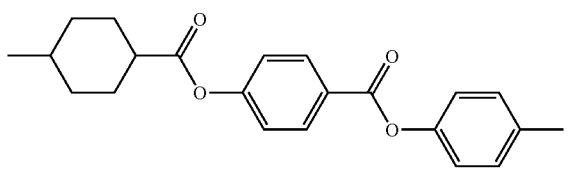
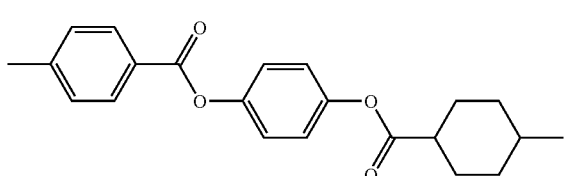
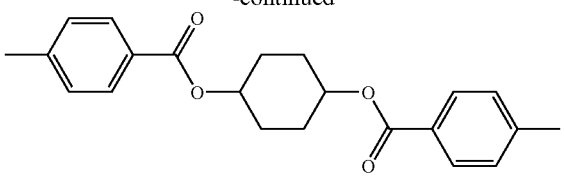
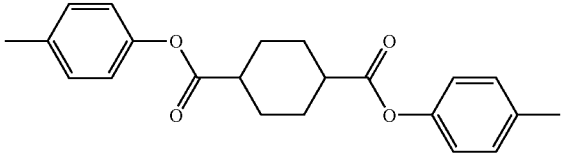
Examples the compound represented by the formula (I) include, but not to be limited to, these described below. The compounds represented by the formula (I) may be prepared according to a method described in a gazette of Tokkohyo No. hei 11-513019.
I-1
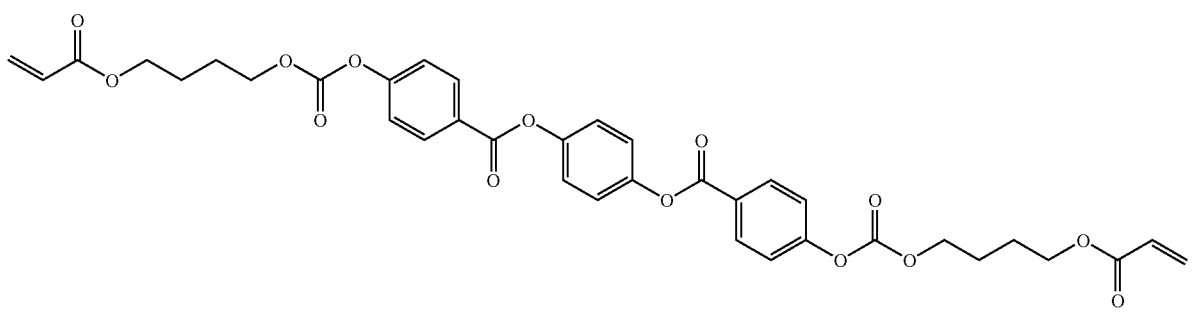
I-2
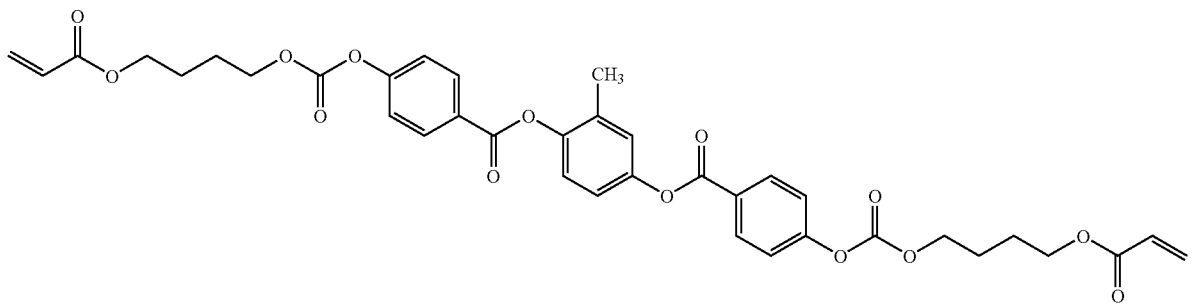
I-3
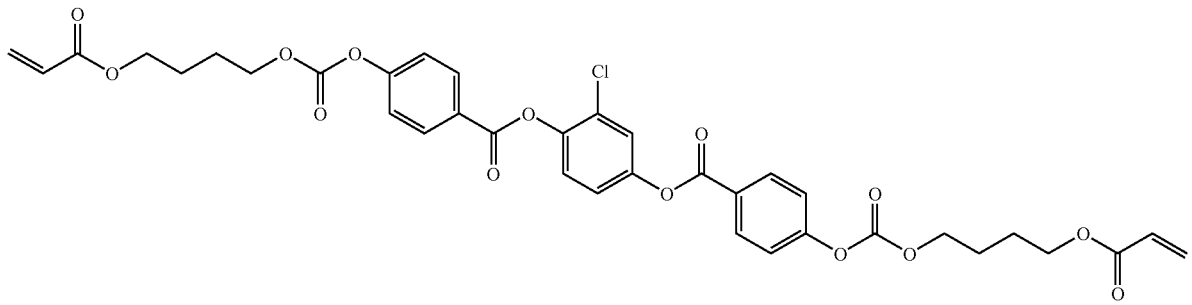

-continued
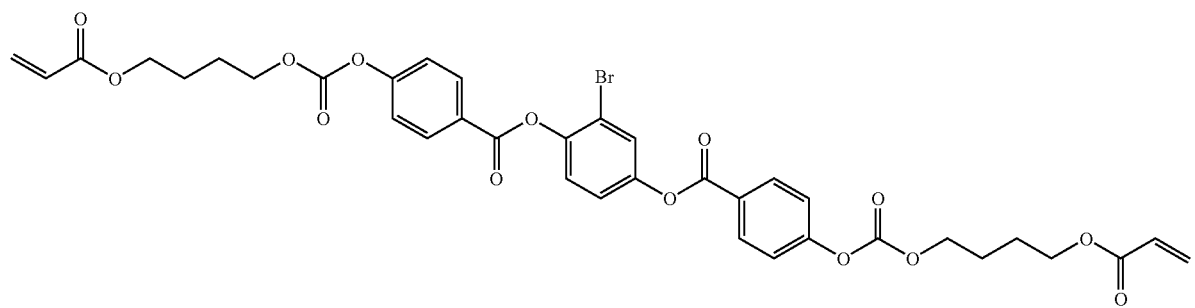
I-4
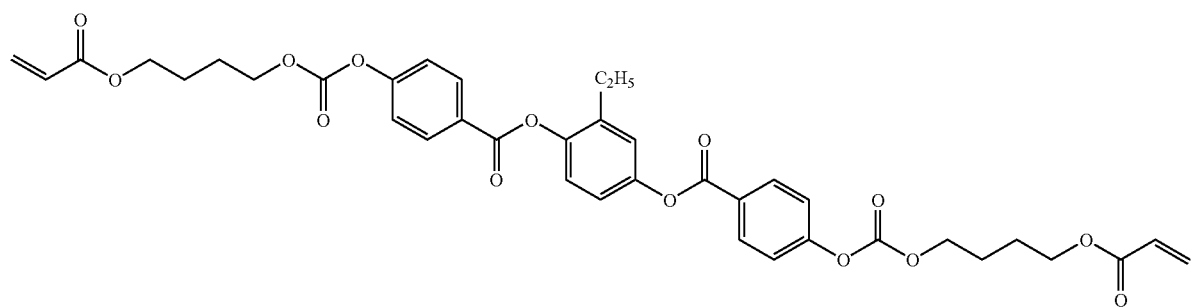
I-5
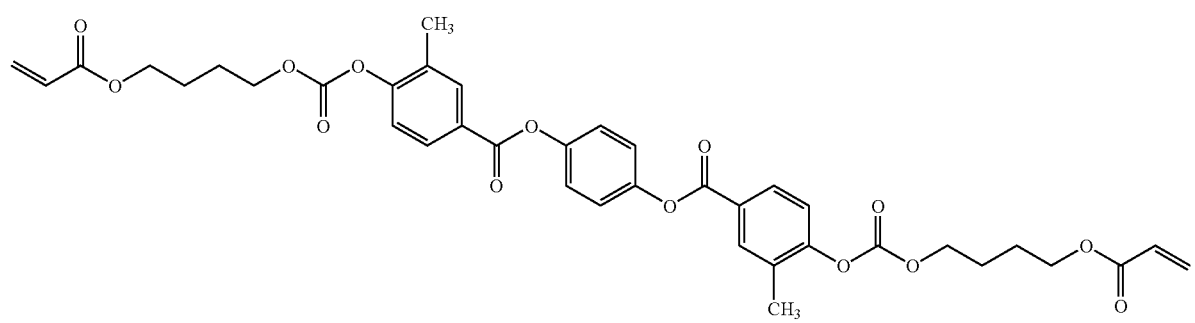
I-6
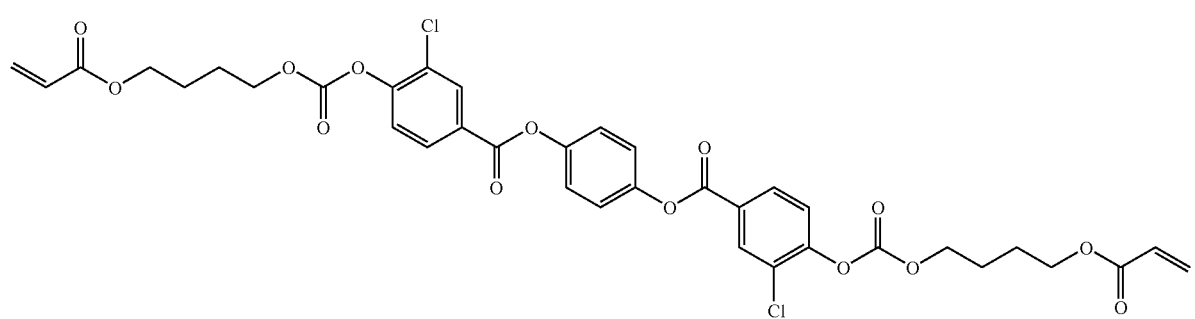
I-7
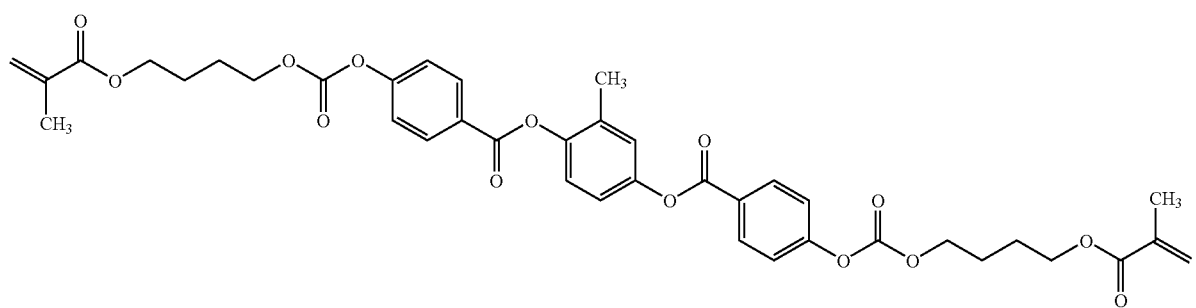
I-8

-continued
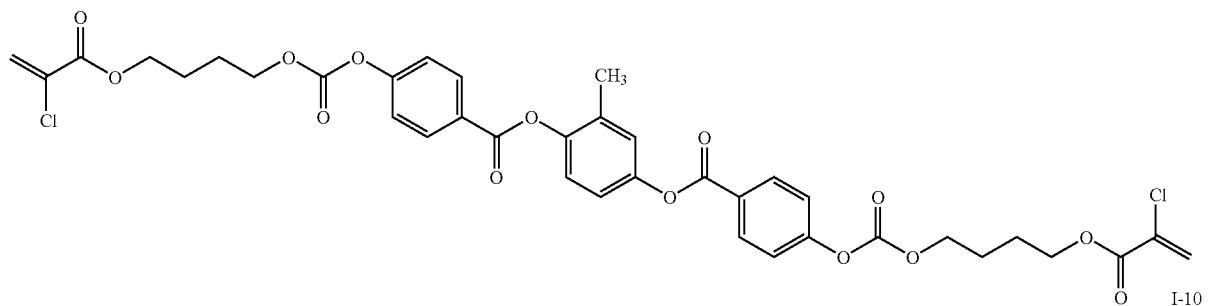
I-9
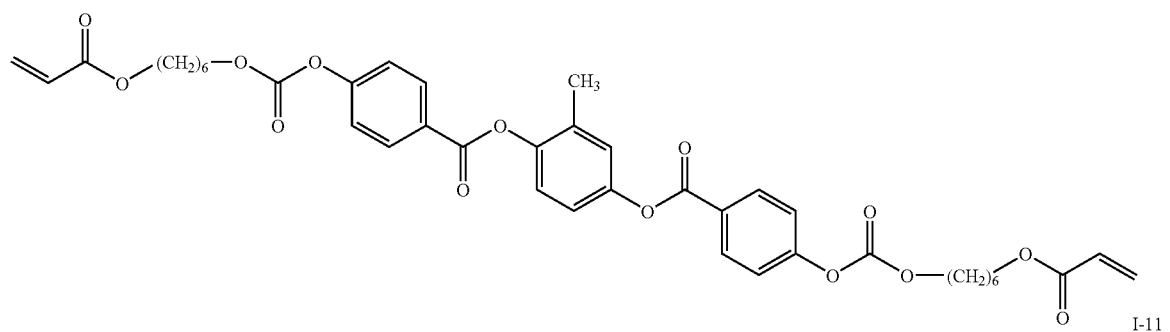
I-10
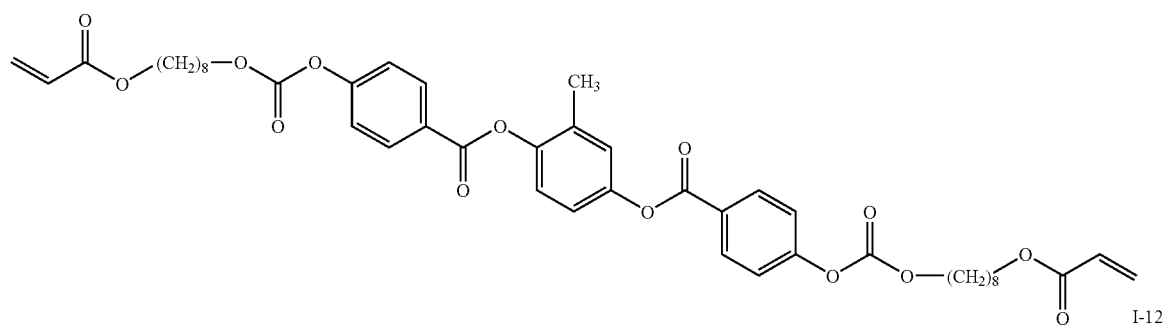
I-11
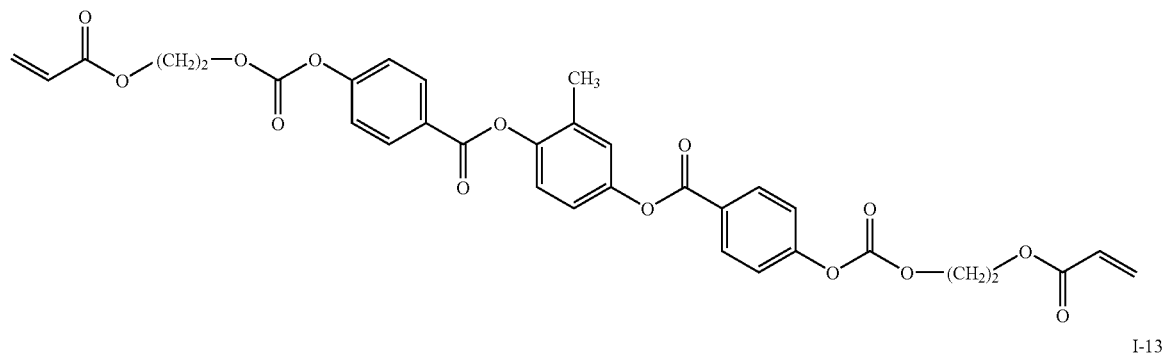
I-12
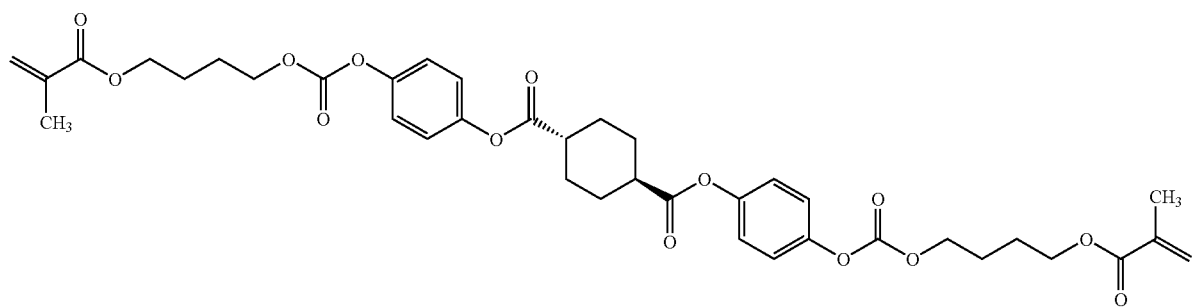
I-13

-continued
I-14
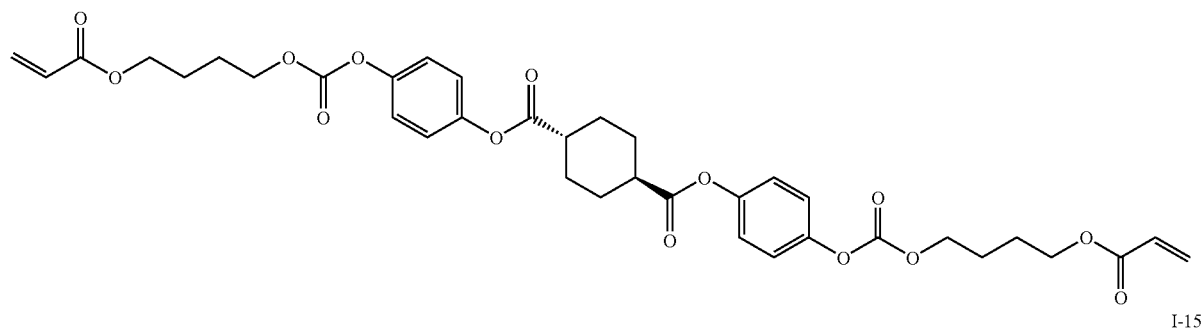
I-15
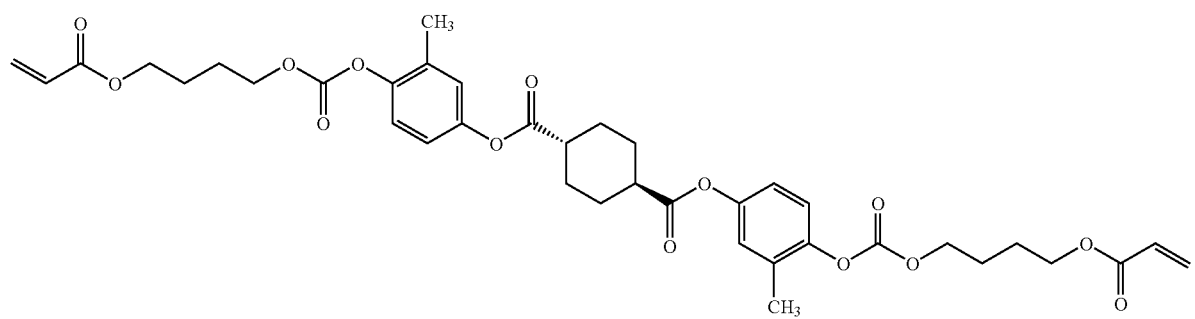
I-16
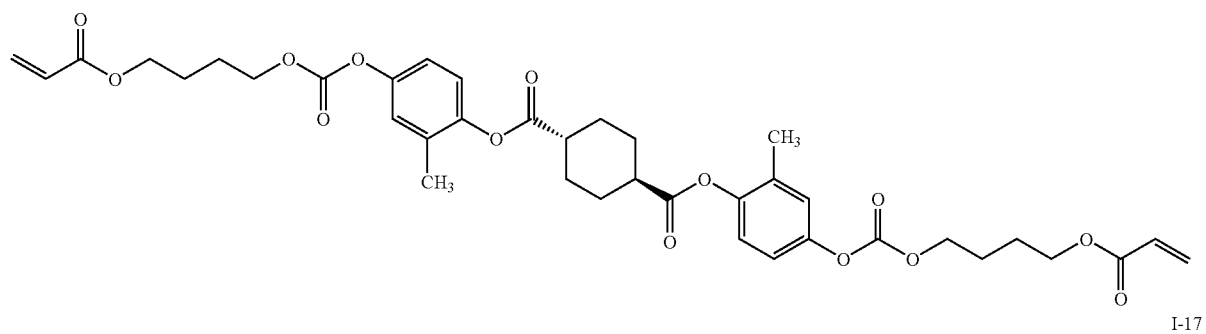
I-17
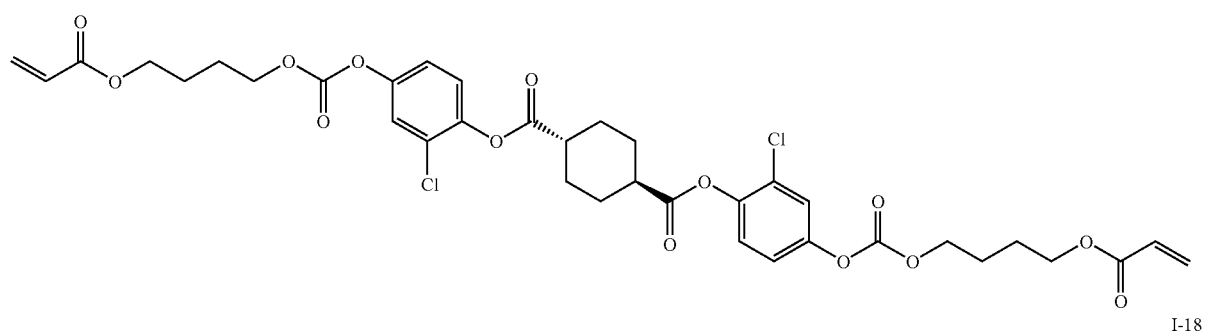
I-18
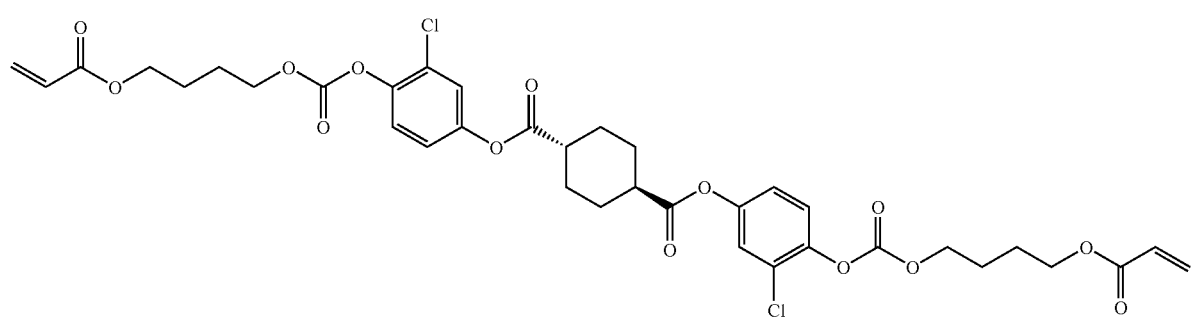

I-19

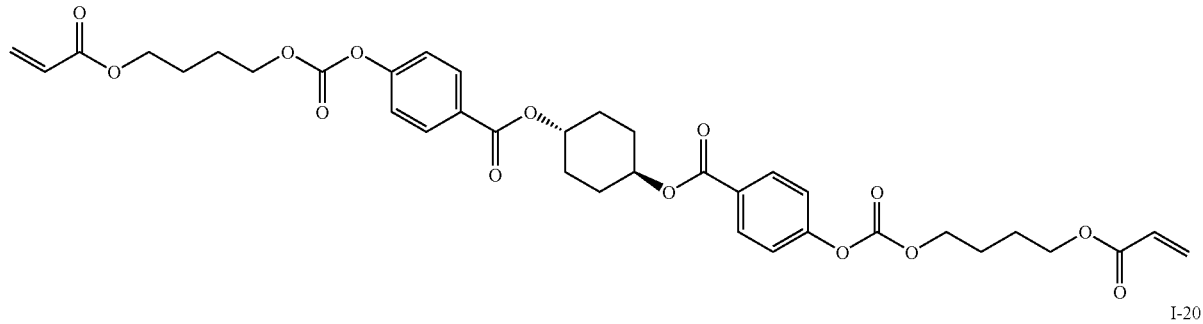

I-20

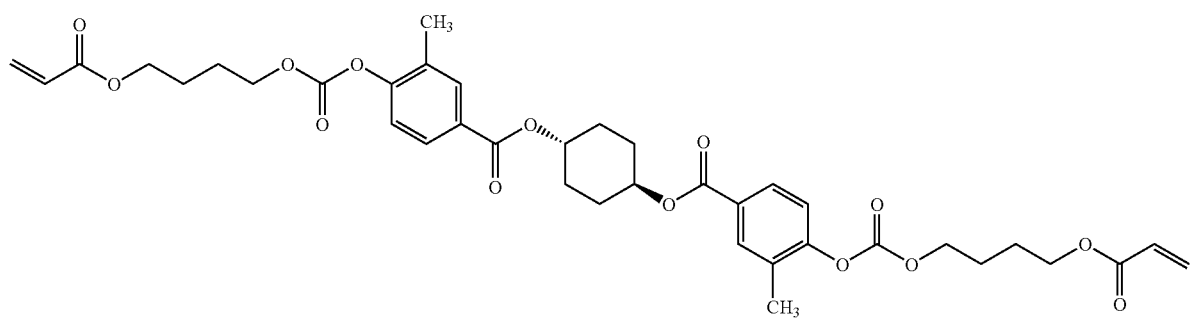

I-21

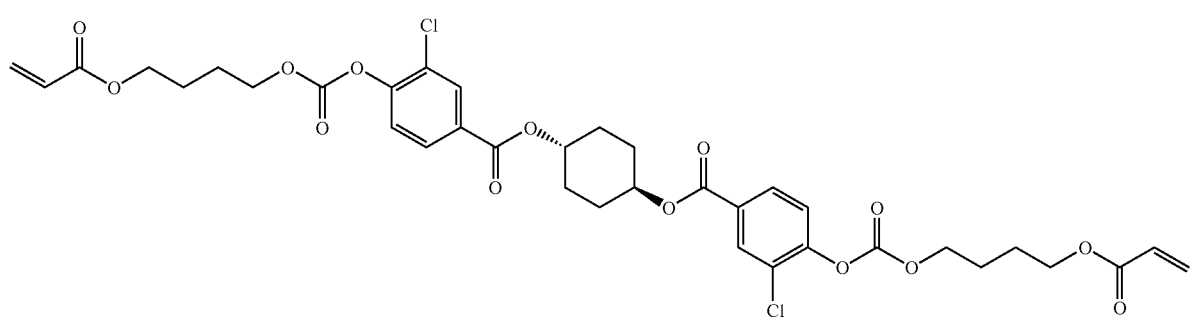

As described above, according to the present invention, discotic liquid-crystalline compounds are also preferably used. Examples of the discotic liquid-crystalline compound, which can be used in the first embodiment, are described in various documents, and include benzene derivatives described in C. Destrade et al., Mol. Cryst., Vol. 171, p. 111 (1981); torxene derivatives described in C. Destrade et al., Mol. Cryst., Vol. 122, p. 141 (1985) and Physics Lett., A, Vol. 78, p. 82 (1990); cyclohexane derivatives described in B. Kohne et al., Angew. Chem., Vol. 96, p. 70 (1984); and aza-crown-base or phenylacetylene-base macrocycles described in J. M. Lehn, J. Chem. Commun., p. 1794 (1985) and in J. Zhang et al., J. Am. Chem. Soc., Vol. 116, p. 2655 (1994). The above mentioned discotic (disk-like) compounds generally have a discotic core in a central portion and groups (L), such as linear alkyl or alkoxy groups or substituted banzoyloxy groups, which radiate from the core. Among them, there are compounds exhibiting liquid crystallinity, and such compounds are generally called as discotic liquid crystal. When such molecules are aligned uniformly, the aggregate of the aligned molecules may exhibit an optically negative uniaxial property.

In the specification, the term of "formed of a discotic compound" is used not only when finally comprising the discotic compound as a low-molecular weight compound, but also when finally comprising a high-molecular weight discotic compound, no longer exhibiting liquid crystallinity, formed by carrying out crosslinking reaction of the low-molecular weight discotic compound having at least one reactive group capable of thermal reaction or photo reaction under heating or under irradiation of light.

According to the present invention, it is preferred that the discotic liquid-crystalline compound is selected from the formula (III) below:

D(-L-P)$_n$    Formula (III)

In the formula, D represents a discotic core, L represents a divalent linking group, P represents a polymerizable group, and n is an integer from 4 to 12.

Preferred examples of the discotic core (D), the divalent linking group (L) and the polymerizable group (P) are respectively (D1) to (D15), (L1) to (L25) and (P1) to (P18) described in Japanese Laid-Open Patent Publication (Tokkai) No. 2001-4837; and the descriptions in the publication regarding the discotic core (D), the divalent linking group (L) and the polymerizable group (P) may be preferably applicable to this embodiment.

Preferred examples of the discotic compound are shown below.
TE-1
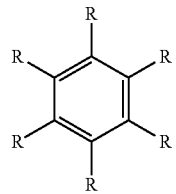
(1) R: n-C$_{11}$H$_{23}$—C(=O)—O—
(2) n-C$_{12}$H$_{25}$O—C$_6$H$_4$—C(=O)—O— or
(3) n-C$_{12}$H$_{25}$O—C$_6$H$_4$—N=N—C$_6$H$_4$—C(=O)—O—
TE-2
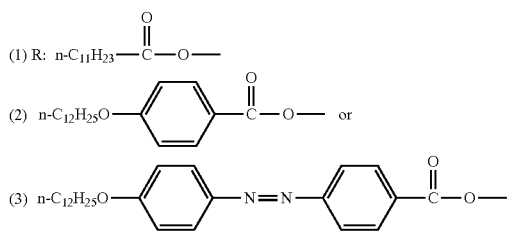
R: n-C$_{12}$H$_{25}$—
TE-3
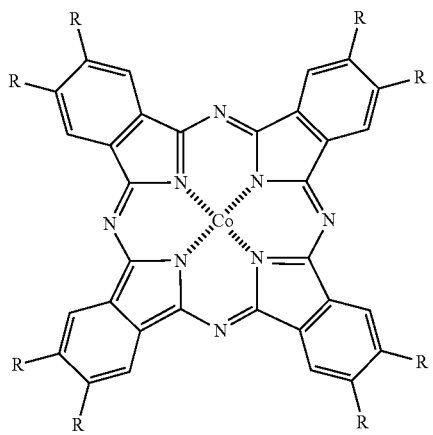
R: n-C$_{12}$H$_{25}$OCH$_2$—
TE-4
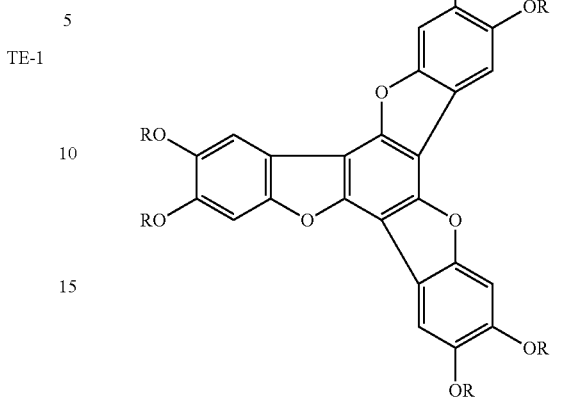
(1) R: n-C$_{12}$H$_{25}$O—C$_6$H$_4$—C(=O)— or
(2) n-C$_{13}$H$_{27}$CO—
TE-5
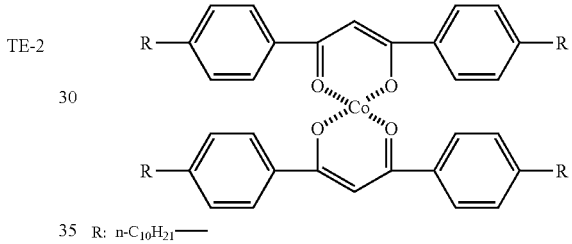
R: n-C$_{10}$H$_{21}$—
TE-6
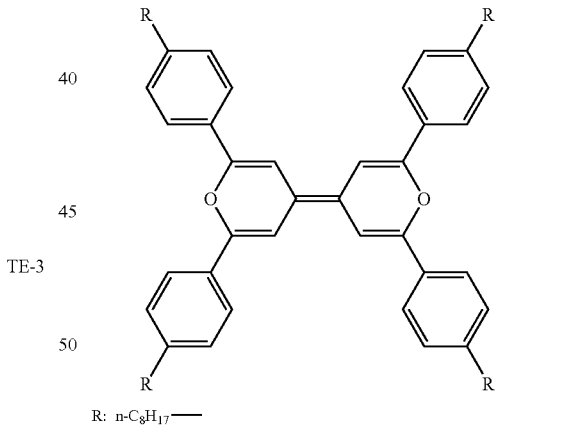
R: n-C$_8$H$_{17}$—
TE-7
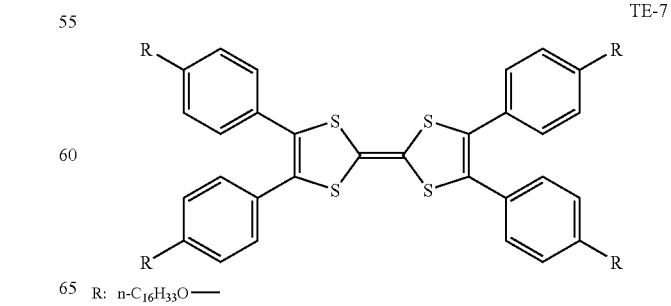
R: n-C$_{16}$H$_{33}$O—

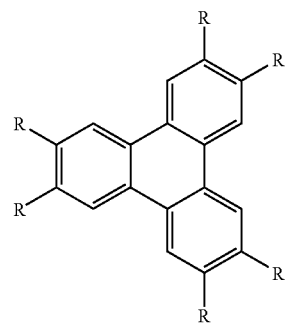

(1) n-C$_m$H$_{2m+1}$O—
(m: an integer from 2 to 5)

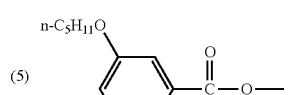

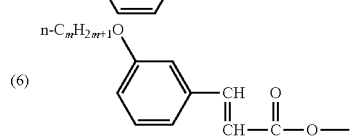

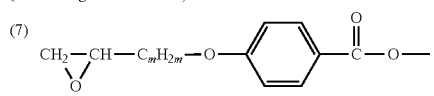

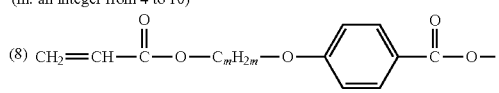

(m: an integer from 7 to 10)

(7)

(m: an integer from 4 to 10)

(8) CH$_2$=CH—C(=O)—O—C$_m$H$_{2m}$—O—C$_6$H$_4$—C(=O)—O—

(m: an integer from 4 to 10)

TE-9

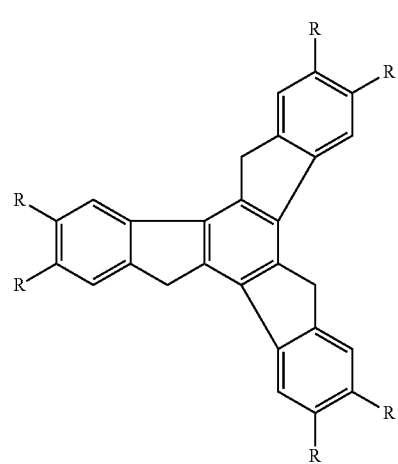

TE-8  R:

(1) n-C$_{10}$H$_{21}$C(=O)—O—

(2) n-C$_{16}$H$_{33}$O—C$_6$H$_4$—C(=O)—O—

(3) CH$_3$O—C$_6$H$_4$—NHCO(CH$_2$)$_8$C(=O)—O—

TE-10

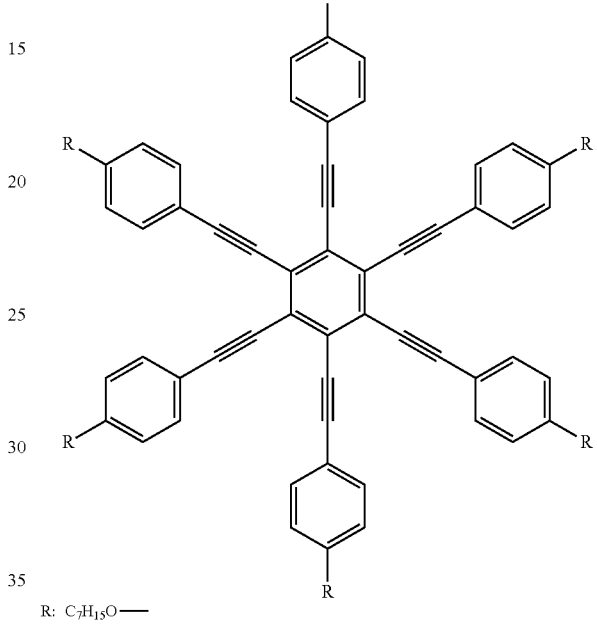

R: C$_7$H$_{15}$O—

TE-11

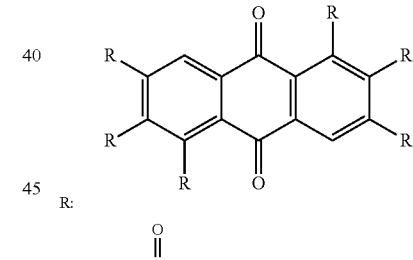

R:

(1) n-C$_{13}$H$_{27}$C(=O)—O—

(2) n-C$_{12}$H$_{25}$O—C$_6$H$_4$—N=CH—C$_6$H$_4$—C(=O)—O—

The optically anisotropic layer may be formed according to a process comprising applying a composition (for example a coating liquid) comprising at least on liquid crystalline compound to a surface of an alignment layer, described in detail later, aligning liquid crystalline molecules as to show a liquid crystal phase, and fixing the liquid crystal phase under heating or light-irradiating. The optically anisotropic layer exhibiting optical biaxiality may exactly compensate a liquid crystal cell, in particular a VA-mode liquid crystal cell. When a rod-like liquid-crystalline compound is used to form a film exhibiting optical biaxiality, it is necessary to align rod-like molecules in a twisted cholesteric orientation, or in a twisted hybrid cholesteric orientation in which the tilt angles of the molecules are varied gradually in the thickness-direction, and then to distort the twisted cholesteric orientation or the twisted hybrid cholesteric orientation by irradiation of polarized light. Examples of the method for distorting the orientation by the polarized light irradiation include a method of using a dichroic liquid-crystalline polymerization initiator (EP1389199A1), and a method of using a rod-like liquid-crystalline compound having in the molecule thereof a photo-alignable functional group such as cinnamoyl group (Japanese Laid-Open Patent Publication "Tokkai" No. 2002-6138). The present invention can adopt any of these methods.

The optically anisotropic layer exhibiting optical uniaxiality may exactly compensate a liquid crystal cell, in particular a VA-mode or IPS mode liquid crystal cell, in combination with either of the protective films of upper or lower side polarizing plates, of which optical anisotropy is optimized. In either case, with respect to reduction of viewing angle dependence of color, which is the purpose of the present invention, the liquid crystal cell can optically be compensated in an exact manner over a wide wavelength range, because the wavelength dispersion of retardation of the polarizer plate protective film is generalized, that is, the retardation reduces as the wavelength increases. The optically anisotropic layer as the polarizer plate protective film is preferably c-plate for a VA mode; and is preferably an optically biaxial film in which the minimum refractive index is found in a thickness direction for an IPS mode. The optically anisotropic layer, exhibiting optical uniaxiality, included in the transfer material of the present invention may be produced by aligning uniaxial rod-like or discotic liquid crystalline molecules so that their directors are aligned uniaxially. Such uniaxial alignment can be created typically by a method of aligning a non-chiral liquid crystal on a rubbed alignment layer or on a photo-alignment layer, by a method of aligning liquid crystal with the aid of magnetic field or electric field, or by a method of aligning liquid crystal with applying external force such as stretching or shearing.

When a discotic liquid crystalline compound having polymerizable groups is used as the liquid crystalline compound, the discotic molecules in the layer may be fixed in any alignment state such as a horizontal alignment state, vertical alignment state, tilted alignment state and twisted alignment state. It is preferred that the molecules are fixed in a horizontal alignment state, a vertical alignment state and a twisted alignment state, and it is more preferred that the molecules fixed in a horizontal alignment state.

When two or more optically anisotropic layers formed of the liquid-crystalline compositions are stacked, the combination of the liquid-crystalline compositions is not particularly limited, and the combination may be a stack formed of liquid-crystalline compositions all comprising discotic liquid-crystalline molecules, a stack formed of liquid-crystalline compositions all comprising rod-like liquid-crystalline molecules, or a stack formed of a layer comprising discotic liquid-crystalline molecules and a layer comprising rod-like liquid-crystalline molecules. Combination of orientation state of the individual layers also is not particularly limited, allowing stacking of the optically anisotropic layers having the same orientation status, or stacking of the optically anisotropic layer having different orientation states.

The optically anisotropic layer may be formed by applying a coating liquid, containing a liquid-crystalline compound and, if necessary, a polymerization initiator as described below or other additives, to a surface of an alignment layer, described in detail later. The solvent used for preparing the coating liquid is preferably an organic solvent. Examples of organic solvents include amides (e.g., N,N-dimethyl formamide), sulfoxides (e.g., dimethyl sulfoxide), heterocyclic compounds (e.g., pyridine), hydrocarbons (e.g., benzene, hexane), alkyl halides (e.g., chloroform, dichloromethane), esters (e.g., methyl acetate, butyl acetate), ketones (e.g., acetone, methyl ethyl ketone) and ethers (e.g., tetrahydrofuran, 1,2-dimethoxyethane). Alkyl halides and ketones are preferred. Two or more organic solvents may be used in combination.

[Fixing of Liquid-crystalline Molecules in an Alignment State]

For producing the optical compensation sheet of the present invention, it is preferred that the liquid-crystalline molecules in an alignment state are fixed without disordering the state. Fixing is preferably carried out by the polymerization reaction of the reactive groups contained in the liquid-crystalline molecules. The polymerization reaction includes thermal polymerization reaction using a thermal polymerization initiator and photo-polymerization reaction using a photo-polymerization initiator. Photo-polymerization reaction is preferred. Examples of photo-polymerization initiators include alpha-carbonyl compounds (described in U.S. Pat. Nos. 2,367,661 and 2,367,670), acyloin ethers (described in U.S. Pat. No. 2,448,828), alpha-hydrocarbon-substituted aromatic acyloin compounds (described in U.S. Pat. No. 2,722,512), polynuclear quinone compounds (described in U.S. Pat. Nos. 3,046,127 and 2,951,758), combinations of triarylimidazole dimers and p-aminophenyl ketone (described in U.S. Pat. No. 3,549,367), acridine and phenazine compounds (described in Japanese Laid-Open Patent Publication (Tokkai) syo No. 60-105667 and U.S. Pat. No. 4,239,850) and oxadiazole compounds (described in U.S. Pat. No. 4,212,970).

The amount of the photo-polymerization initiators to be used is preferably 0.01 to 20% by weight, more preferably 0.5 to 5% by weight on the basis of solids in the coating liquid. Irradiation for polymerizing the liquid-crystalline molecules preferably uses UV rays. The irradiation energy is preferably 20 mJ/cm$^2$ to 10 J/cm$^2$, and more preferably 100 to 800 mJ/cm$^2$. Irradiation may be carried out in a nitrogen gas atmosphere and/or under heating to facilitate the photo-polymerization reaction.

[Orientation Induced by Irradiation of Polarized Light (Photoinduced Orientation)]

The optically anisotropic layer may exhibit in-plane retardation attributed to photoinduced orientation with the aid of polarized light irradiation. The polarized light irradiation may be carried out at the same time with photo-polymerization process in the fixation of orientation, or the polarized light irradiation may precede and then may be followed by non-polarized light irradiation for further fixation, or the non-polarized light irradiation for fixation may precede and the polarized light irradiation may succeed for the photoinduced orientation. For the purpose of obtaining a large retardation, it is preferable to carry out only the polarized light irradiation, or to carry out the polarized light irradiation first preferably after coating and alignment of the layer comprising the liquid crystalline molecules. The polarized light irradiation is preferably carried out under an inert gas atmosphere having an oxygen concentration of 0.5% or below. The irradiation energy is preferably 20 mJ/cm$^2$ to 10 J/cm$^2$, and more preferably 100 mJ/cm$^2$ to 800 mJ/cm$^2$. The luminance is preferably 20 to 1000 mW/cm$^2$, more preferably 50 to 500 mW/cm$^2$, and still more preferably 100 to 350 mW/cm$^2$. Types of the liquid-crystalline molecule to be hardened by the polarized light irradiation are not particularly limited, wherein the liquid-crystalline molecule having an ethylenic unsaturated group as the reactive group is preferable. It is preferred that the irradiation light to be used has a peak falling within the range from 300 to 450 nm, more preferred from 350 to 400 nm.

The optically anisotropic layer exhibiting in-plane retardation attributed to the photoinduced orientation with the aid of the polarized light irradiation is excellent in particular for optical compensation of VA-mode liquid crystal display device.

[Post-curing with UV-light Irradiation after Irradiation of Polarized Light]

After the first irradiation of polarized light for photoinduced orientation, the optically anisotropic layer may be irradiated with polarized or non-polarized light so as to improve the reaction rate (post-curing step). As a result, the adhesiveness is improved and, thus, the optically anisotropic layer can be produced with larger feeding speed. The post-curing step may be carried out with polarized or non-polarized light, and preferably with polarized light. Two or more steps of post-curing are preferably carried out with only polarized light, with only non-polarized light or with combination of polarizing and non-polarized light. Then polarized and non-polarized light are combined, irradiating with polarized light previous to irradiating with non-polarized light is preferred. The irradiation of UV light may be carried out under an inert gas atmosphere 1 and preferably under an inert gas atmosphere where the oxygen gas concentration is 0.5% or below. The irradiation energy is preferably 20 mJ/cm$^2$ to 10 J/cm$^2$, and more preferably 100 to 800 mJ/cm$^2$. The luminance is preferably 20 to 1000 mW/cm$^2$, more preferably 50 to 500 mW/cm$^2$, and still more preferably 100 to 350 mW/cm$^2$. As the irradiation wave length, it is preferred that the irradiation with polarized light has a peak falling within the range from 300 to 450 nm, more preferred from 350 to 400 nm. It is also preferred that the irradiation with non-polarized light has a peak falling within the range from 200 to 450 nm, more preferred from 250 to 400 nm.

When the transfer material of the present invention is transferred onto the substrate of the liquid crystal cell to thereby form an optically anisotropic layer and a color filter, optical characteristics of the optically anisotropic layer are preferably adjusted to those optimized for optical compensation upon being illuminated by R light, G light and B light. More specifically, it is preferable to optimize the optical characteristics of the optically anisotropic layer for optical compensation upon being illuminated by the R light if the photosensitive polymer layer is colored in red for use as an R layer of the color filter; to optimize the optical characteristics of the optically anisotropic layer for optical compensation upon being illuminated by the G light if the photosensitive polymer layer is colored in green; and to optimize the optical characteristics of the optically anisotropic layer for optical compensation upon being illuminated by the B light if the photosensitive polymer layer is colored in blue. The optical characteristics of the optically anisotropic layer can be adjusted to a desirable range typically based on types of the liquid crystalline compound, types of the alignment aid agent, amount of addition thereof, types of the alignment layer, rubbing conditions for the alignment layer, and conditions for illuminating polarized light.

At least one compound represented by a formula (1), (2) or (3) shown below may be added to the composition used for forming the optically anisotropic layer may comprise, in order to promote aligning the liquid-crystalline molecules horizontally. In the specification, each of the terms "horizontal alignment" and "planar alignment" means that, regarding rod-like liquid-crystalline molecules, the molecular long axes thereof and a layer plane are parallel to each other, and, regarding discotic liquid-crystalline molecules, the disk-planes of the cores thereof and a layer plane are parallel to each other. However, they are not required to be exactly parallel to each other, and, in the specification, each of the terms "horizontal alignment" and "planar alignment" should be understood as an alignment state in which molecules are aligned with a tilt angle against a layer plane less than 10 degree. The tilt angle is preferably from 0 to 5 degree, more preferably 0 to 3 degree, much more preferably from 0 to 2 degree, and most preferably from 0 to 1 degree.

The formula (1) to (3) will be described in detail below.

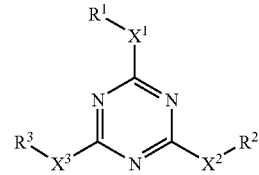

Formula (1)

In the formula, $R^1$, $R^2$ and $R^3$ each independently represent a hydrogen atom or a substituent; and $X^1$, $X^2$ and $X^3$ respectively represent a single bond or a divalent linking group. As the substituent represented by each $R^1$, $R^2$ and $R^3$, preferable examples include a substituted or unsubstituted alkyl group (an unsubstituted alkyl group or an alkyl group substituted with fluorine atom is more preferable), a substituted or unsubstituted aryl group (an aryl group having an alkyl group substituted with fluorine atom is more preferable), a substituted or unsubstituted amino group, an alkoxy group, an alkylthio group, and a halogen atom. The divalent linking group represented by each of $X^1$, $X^2$ and $X^3$ may preferably be an alkylene group, an alkenylene group, a divalent aromatic group, a divalent heterocyclic group, —CO—, —NR$^a$— (wherein R$^a$ represents a $C_{1-5}$ alkyl group or hydrogen atom), —O—, —S—, —SO—, —SO$_2$—, or a divalent linking group formed by combining two or more groups selected from the above listed groups). The divalent linking group is more preferably a group selected from a group consisting of an alkylene group, phenylene group, —CO—, —NR$^a$—, —O—, —S—, and —SO$_2$—, or a divalent linking group formed by combining two or more groups selected from the above group. The number of the carbon atoms of the alkylene group is preferably 1 to 12. The number of the carbon atoms of the alkenylene group is preferably 2 to 12. The number of the carbon atoms of the divalent aromatic group is preferably 6 to 10.

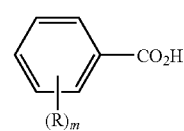

Formula (2)

In the formula, R represents a substituent, and m represents an integer of 0 to 5. When m is 2 or more, plural R are same or different to each other. Preferable examples of the substituent represented by R are the same as the examples listed above for each of $R^1$, $R^2$, and $R^3$. m is preferably an integer of 1 to 3, more preferably 2 or 3.

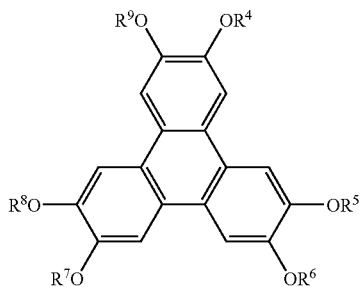

Formula (3)

In the formula, $R^4$, $R^5$, $R^6$, $R^7$, $R^8$ and $R^9$ each independently represents a hydrogen atom or a substituent. Preferable examples of the substituent represented by each of $R^4$, $R^5$, $R^6$, $R^7$, $R^8$ and $R^9$ are the same as the examples listed above for each of $R^1$, $R^2$ and $R^3$ in the general formula (1).

Examples of the planar alignment agent, which can be used in the present invention, include those described in Japanese Laid-Open Patent Publication (Tokkai) No. 2005-099248 and the methods for preparing such compounds are described in the document.

The amount of the compound represented by the formula (1), (2) or (3) is preferably from 0.01 to 20 weight %, more preferably from 0.01 to 10 weight % and much more preferably from 0.02 to 1 weight %. One type compound may be selected from the formula (1), (2) or (3) and used singly, or two or more type of compounds may be selected from the formula (1), (2) or (3) and used in combination.

[Alignment Layer]

An alignment layer may be used for forming the optically anisotropic layer. The alignment layer may be generally formed on a surface of the support or a surface of an undercoating layer formed on the support. The alignment layer has ability of controlling the alignment of liquid crystalline molecules thereon, and, as far as having such ability, may be selected from various known alignment layers. The alignment layer that can be employed in the present invention may be provided by rubbing a layer formed of an organic compound (preferably a polymer), oblique vapor deposition, the formation of a layer with microgrooves, or the deposition of organic compounds (for example, omega-tricosanoic acid, dioctadecylmethylammonium chloride, and methyl stearate) by the Langmuir-Blodgett (LB) film method. Further, alignment layers imparted with orientation functions by exposure to an electric or magnetic field or irradiation with light are also known.

Examples of the organic compound, which can be used for forming the alignment layer, include polymers such as polymethyl methacrylate, acrylic acid/methacrylic acid copolymer, styrene/maleimide copolymer, polyvinyl alcohol, poly (N-methylol acrylamide), styrene/vinyl toluene copolymer, chlorosulfonated polyethylene, nitrocellulose, polyvinyl chloride, chlorinated polyolefin, polyester, polyimide, vinyl acetate/vinyl chloride copolymer, ethylene/vinyl acetate copolymer, carboxymethyl cellulose, polyethylene, polypropylene and polycarbonates; and silane coupling agents. Preferred examples of the polymer include polyimide, polystyrene, styrene based polymers, gelatin, polyvinyl alcohol and alkyl-modified polyvinyl alcohol having at least one alkyl group (preferably $C_6$ or longer alkyl group).

For production of an alignment layer, a polymer may preferably used. The types of polymer, which is used for forming the alignment layer, may be decided depending on what types of alignment state of liquid crystal (in particular how large of tilt angle) is preferred. For forming an alignment layer capable of aligning liquid crystalline molecules horizontally, it is required not to lower the surface energy of the alignment layer, and polymer may be selected from typical polymers have been used for alignment layers. Examples of such polymer are described in various documents concerning liquid crystal cells or optical compensation sheets. Polyvinyl alcohols, modified polyvinyl alcohols, poly acrylic acid, acrylic acid/acrylate copolymers, polyvinyl pyrrolidone, cellulose and modified cellulose are preferably used. Materials used for producing the alignment layer may have at least one functional group capable of reacting with the reactive group of liquid crystalline compound in the optically anisotropic layer. Examples of the polymer having such s functional group include polymers having side chains comprising a repeating unit having such functional group, and polymers having a cyclic moiety substituted with such a functional group. It is more preferable to use an alignment layer capable of forming a chemical bond with the liquid-crystalline compound at the interface, and a particularly preferable example of such alignment layer is a modified polyvinyl alcohol, described in Japanese Laid-Open Patent Publication "Tokkaihei" No. 9-152509, which has an acrylic group introduced in the side chain thereof using acid chloride or Karenz MOI (product of Showa Denko K.K.). The thickness of the alignment layer is preferably 0.01 to 5 μm, and more preferably 0.05 to 2 μm. An alignment layer (also referred to as an intermediate layer/alignment layer in this specification) in the transfer material of the present invention may also have a function as a layer for oxygen shut-off.

Polyimide, preferably fluorine-containing polyimide, films, which have been used as an alignment layer for LCD, are also preferable. The film may be formed by applying poly(amic acid), provided, for example, as LQ/LX series products by Hitachi Chemical Co., Ltd or as SE series products by NISSAN CHEMICAL INDUSTRIES, LTD, to a surface of the support, heating at 100 to 300° C. for 0.5 to one hour to form a polymer layer, and rubbing a surface of the polymer layer.

The rubbing treatment may be carried out with known techniques which have been employed in the usual step for aligning liquid crystalline molecules of LCD. In particular, the rubbing treatment may be carried out by rubbing a surface of a polymer layer in a direction with paper, gauze, felt, rubber, nylon or polyester fiber or the like. The rubbing treatment may be carried out, for example, by rubbing a surface of a polymer layer in a direction at several times with a cloth having same length and same diameter fibers grafted uniformly.

Examples of the material used in oblique vapor deposition include metal oxides such as $SiO_2$, which is a typical material, $TiO_2$ and $ZnO_2$; fluorides such as $MgF_2$; metals such as Au and Al. Any high dielectric constant metal oxides can be used in oblique vapor deposition, and, thus, the examples thereof are not limited to the above mentioned materials. The inorganic oblique deposition film may be produced with a deposition apparatus. The deposition film may be formed on an immobile polymer film (a support) or on a long film fed continuously.

According to the present invention, the optically anisotropic layer may be produced on a temporal alignment layer, and may be transferred it onto the transparent support typically using a pressure-sensitive adhesive, but it is preferable that the process doesn't include such step, from the viewpoint of productivity.

[Photosensitive Polymer Layer]

The photosensitive polymer layer included in the transfer material of the present invention may be formed of a photosensitive polymer composition, for which either of positive type and negative type is acceptable so far as it can generate difference in transferability between the exposed region and non-exposed region after being irradiated by light through a mask or the like. The photosensitive polymer layer is preferably formed of a polymer composition comprising at least (1) an alkaline-soluble polymer, (2) a monomer or oligomer, and (3) two or more types of photopolymerization initiators having different photoreaction mechanisms to each other. In an embodiment in which the optically anisotropic layer is formed on the substrate at the same time with the color filter, it is preferable to use a colored polymer composition additionally comprising (4) a colorant such as dye or pigment.

These components (1) to (4) will be explained below.

(1) Alkali-Soluble Polymer

The alkali-soluble polymer (which may be referred simply to as "binder", hereinafter) is preferably a polymer having, in the side chain thereof, a polar group such as carboxylic acid groups or carboxylic salt. Examples thereof include methacrylic acid copolymer, acrylic acid copolymer, itaconic acid copolymer, crotonic acid copolymer, maleic acid copolymer, and partially-esterified maleic acid copolymer described in Japanese Laid-Open Patent Publication "Tokkaisho" No. 59-44615, Examined Japanese Patent Publication "Tokkosho" Nos. 54-34327, 58-12577 and 54-25957, Japanese Laid-Open Patent Publication "Tokkaisho" Nos. 59-53836 and 59-71048. Cellulose derivatives having on the side chain thereof a carboxylic acid group can also be exemplified. Besides these, also cyclic acid anhydride adduct of hydroxyl-group-containing polymer are preferably used. Particularly preferable examples include copolymer of benzyl (meth) acrylate and (meth) acrylic acid described in U.S. Pat. No. 4,139,391, and multi-system copolymer of benzyl (meth) acrylate and (meth)acrylic acid and other monomer. These binder polymers having polar groups may be used independently or in a form of composition comprising a general film-forming polymer. The content of the polymer generally falls in the range from 20 to 50% by weight, and more preferably from 25 to 45% by weight, of the total weight of the solid components contained in the polymer composition.

(Meth) acrylic acid, as the monomer unit preferably used for the alkali-soluble polymer, has carboxy group. This carboxy group, for example, may be used as a reactive group for a reaction with the reactive group present in the optically anisotropic layer.

Other than the alkali-soluble polymer, a compound having any one or more of carboxy group, hydroxy group, amino group, and thiol group may be added to the photosensitive polymer layer as the cationic-polymerizable monomer or oligomer explained below. The compound may preferably further have epoxy group. It is also preferable that the photosensitive polymer layer comprise further a compound having epoxy group other than the compound having carboxy group or the like. When the photosensitive polymer layer does not comprise a compound having epoxy group, the optically anisotropic layer preferably comprise a compound having epoxy group (refer to Table 1 below).

(2) Monomer or Oligomer

A radical-polymerizable monomer or oligomer used for the photosensitive polymer layer is preferably selected from compounds, having two or more ethylenic unsaturated double bonds, capable of causing addition polymerization upon being irradiated by light. As such monomer and oligomer, compounds having at least one ethylenic unsaturated group capable of addition polymerization, and having a boiling point of 100° C. or above under normal pressure can be exemplified. The examples include monofunctional acrylates and monofunctional methacrylates such as polyethylene glycol mono(meth)acrylate, polypropylene glycol mono(meth) acrylate and phenoxyethyl(meth)acrylate; multi-functional acrylate and multi-functional methacrylate, obtained by adding ethylene oxide or propylene oxide to multi-functional alcohols such as trimethylol propane and glycerin, and then converting them into (meth)acrylates, such as polyethylene glycol di(meth)acrylate, polypropylene glycol di(meth)acrylate, trimethylolethane triacrylate, trimethylolpropane tri (meth)acrylate, trimethylolpropane diacrylate, neopentyl glycol di(meth)acrylate, pentaerythritol tetra(meth)acrylate, pentaerythritol tri(meth)acrylate, dipentaerythritol hexa(meth)acrylate, dipentaerythritol penta(meth)acrylate, hexanediol di(meth)acrylate, trimethylol propane tri(acryloyloxypropyl)ether, tri(acryloyloxyethyl)isocyanurate, tri (acryloyloxyethyl)cyanurate, glycerin tri(meth)acrylate.

Additional examples of multi-functional acrylates and methacrylates include urethane acrylates such as those described in Examined Japanese Patent Publication "Tokkosho" Nos. 48-41708, 50-6034 and Japanese Laid-Open Patent Publication "Tokkaisho" No. 51-37193; polyester acrylates such as those described in Japanese Laid-Open Patent Publication "Tokkaisho" No. 48-64183, Examined Japanese Patent Publication "Tokkosho" Nos. 49-43191 and 52-30490; and epoxyacrylates which are reaction products of epoxy polymer and (meth)acrylic acid. Of these, trimethylolpropane tri(meth)acrylate, pentaerythritol tetra(meth)acrylate, dipentaerythritol hexa(meth)acrylate, dipentaerythritol penta(meth)acrylate are preferable.

Besides these, also "polymerizable compound B" described in the Japanese Laid-Open Patent Publication "Tokkaihei" No. 11-133600 are exemplified as the preferable examples.

These monomers or oligomers can be used independently or in combination of two or more species thereof. The content of the monomer or oligomer generally falls in the range from 5 to 50% by weight, and more preferably from 10 to 40% by weight, of the total weight of the solid components contained in the polymer composition.

The aforementioned photosensitive polymer layer preferably also comprises a cationic-polymerizable monomer or oligomer. As the cationic-polymerizable monomer or oligomer, examples include a cyclic ether, a cyclic formal, an acetal, a vinylalkyl ether, a compound having thiirane group, an epoxy compound such as a bisphenol-type epoxy polymer, a Novolac-type epoxy polymer, an alicyclic epoxy polymer, an epoxidated unsaturated aliphatic acid, or an epoxidated polybutadiene. Examples of such monomer or oligomer include, as well as the compounds described in "Shin-epoxy-jyushi (Novel epoxy polymers)" written and edited by Hiroshi Kakiuchi, published by Sho-ko-doh in 1985, and "Epoxy-jyushi (Epoxy polymers)" written and edited by Kuniyuki Hashimoto, published by Nikkan Kogyo Shinbun LTD. in 1969, a glycidyl ether having three functional groups (such as trimethyrolethane triglycidyl ether, trimethyrolpropane triglycidyl ether, glycerol triglycidyl ether, triglycidyl-trishydroxyethyl isocyanulate and the like), a glycidyl ether having four or more functional groups (such as sorbitol tetraglycidyl ether, pentaerythritol tetraglycidyl ether, a polyglycidyl ether of cresol-novolac polymer, a polyglycidyl ether of phenol-novolac polymer and the like), a alicyclic epoxy compounds having three or more functional groups (EPOLEAD GT-301, EPOLEAD GT-401, and EHPE, manufactured by Daicel Chemical Industries Ltd., polycyclohexyl epoxymethyl ether of phenol-novolac polymer, and the like), an oxetane having three or more functional groups (OX-SQ and PNOX-1009 manufactured by TOAGOSEI Co. Ltd. and the like) and the like.

(3) Photopolymerization Initiator

In the specification, the term "a (photo)polymerization initiator" means or a (photo)polymerization initiator or a (photo) polymerization initiator system.

In the photosensitive polymer layer of the transfer material of the present invention, two or more types of initiators having different photoreaction mechanisms to each other are characteristically used as the photopolymerization initiator. When at least two types of photopolymerization initiator are used, the display characteristics can be improved and non-uniformity in the display can be reduced. Besides, a reactive group in the optically anisotropic layer which does not react by the ultra-violet ray irradiation in the formation of the optically anisotropic layer can be brought into a reaction with the reactive group in the photosensitive polymer layer in a different photoreaction mechanism from that in the formation of the optically anisotropic layer when ultra-violet ray irradiation is conducted for the patterning on the liquid crystal cell substrate. As a result, the two layers adhere strongly via chemical bonds, and thus troubles such as delamination in the liquid crystal cell hardly occur. Further, accuracy of the patterning can be improved by adhesion of only the exposed parts in the patterning. The trouble such as delamination in the liquid crystal cell or the defective patterning is reflected in the property of the liquid crystal display device as defect and light leakages in pixels. Therefore, by using the transfer material of the present invention, a liquid crystal display device having no defect in pixels and having no or reduced light leakages in pixels particularly in the black state, can be produced.

As the photopolymerization initiators added to the photosensitive polymer layer, it is preferable that at least one of the initiators is a radical-polymerization initiator, or at least one of the initiators is a cationic-polymerization initiator. The photopolymerization initiators added to the photosensitive polymer layer may also preferably be at least one type of radical-polymerization initiators and at least one type of cationic-polymerization initiators. The radical-polymerization initiator and the cationic-polymerization initiator have different photoreaction mechanisms to each other.

The radical-polymerization initiator can be exemplified by vicinal polyketaldonyl compounds disclosed in U.S. Pat. No. 2,367,660, acyloin ether compounds described in U.S. Pat. No. 2,448,828, aromatic acyloin compounds substituted by α-hydrocarbon described in U.S. Pat. No. 2,722,512, poly-nuclear quinone compounds described in U.S. Pat. Nos. 3,046,127 and 2,951,758, combination of triaryl imidazole dimer and p-aminoketone described in U.S. Pat. No. 3,549,367, benzothiazole compounds and trihalomethyl-s-triazine compounds described in Examined Japanese Patent Publication "Tokkosho" No. 51-48516, trihalomethyl-triazine compounds described in U.S. Pat. No. 4,239,850, and trihalomethyl oxadiazole compounds described in U.S. Pat. No. 4,212,976. Trihalomethyl-s-triazine, trihalomethyl oxadiazole and triaryl imidazole dimer are particularly preferable.

Besides these, "polymerization initiator C" described in Japanese Laid-Open Patent Publication "Tokkaihei" No. 11-133600 can also be exemplified as a preferable example. The content of the radical polymerization initiator generally falls in the range from 0.5 to 20% by weight, and more preferably from 1 to 15% by weight, of the total weight of the solid components contained in the polymer composition.

As the cationic-polymerization initiator, examples include, an aryl diazonium salt of a Lewis acid such as tetrafluoroborate and hexafluorophosphate, a double salt such as diaryl iodonium salt and triaryl sulfonium salt, a mixture system of a silane compound which generates silanol (such as benzylsilyl ether, o-nitrobenzylsilyl ether, and triphenyl(t-butyl)peroxy silane) and an ammonium complex such as tris(ethylacetoacetic acid)ammmounim. The content of the cationic polymerization initiator generally falls in the range from 0.5 to 20% by weight, and more preferably from 1 to 15% by weight, of the total weight of the solid components contained in the polymer composition.

Preferable combinations of the polymerization initiator and the reactive group comprised in the optically anisotropic layer and the photosensitive polymer layer are listed in Table 1.

TABLE 1

| | Optically anisotropic layer | | Photosensitive polymer layer | |
|---|---|---|---|---|
| Combination | Initiator | Reactive group | Initiator | Reactive group |
| 1 | radical | (meth)acrylic group + carboxy group hydroxy group amino group thiol group | radical + cationic | (meth)acrylic group + epoxy group |
| 2 | radical | (meth)acrylic group + epoxy group | radical + cationic | (meth)acrylic group + carboxy group hydroxy group amino group thiol group |
| 3 | radical | (meth)acrylic group + epoxy group + carboxy group hydroxy group amino group thiol group | radical + cationic | (meth)acrylic group + epoxy group + carboxy group hydroxy group amino group thiol group |

(4) Colorant

The polymer composition may be added with any of known colorants (dyes, pigments). The pigment is desirably selected from known pigments capable of uniformly dispersing in the polymer composition, and that the grain size is adjusted to 0.1 μm or smaller, and in particular 0.08 μm or smaller.

The known dyes and pigments can be exemplified by pigments and so forth described in paragraph [0033] in Japanese Laid-open Patent Publication "Tokkai" No. 2004-302015 and in column 14 of U.S. Pat. No. 6,790,568.

Of the above-described colorants, those preferably used in the present invention include (i) C.I.Pigment Red 254 for the colored polymer composition for R (red), (ii) C.I.Pigment Green 36 for the colored polymer composition for G(green), and (iii) C.I.Pigment Blue 15:6 for the colored polymer composition for B (blue). The above-described pigments may be used in combination.

Preferable examples of combination of the above-described pigments include combinations of C.I.Pigment Red 254 with C.I.Pigment Red 177, C.I.Pigment Red 224, C.I.Pigment Yellow 139 or with C.I.Pigment Violet 23; combinations of C.I.Pigment Green 36 with C.I.Pigment Yellow 150, C.I.Pigment Yellow 139, C.I.Pigment Yellow 185, C.I.Pigment Yellow 138 or with C.I.Pigment Yellow 180; and combinations of C.I.Pigment Blue 15:6 with C.I.Pigment Violet 23 or with C.I.Pigment Blue 60.

Contents of C.I.Pigment Red 254, C.I.Pigment Green 36 and C.I.Pigment Blue 15:6 in the combined pigments are preferably 80% by weight or more, and particularly preferably 90% by weight or more for C.I.Pigment Red 254; preferably 50% by weight or more, and particularly preferably 60% by weight or more for C.I.Pigment Green 36; and 80% by weight or more, and particularly preferably 90% by weight or more for C.I.Pigment Blue 15:6.

The pigments are preferably used in a form of dispersion liquid. The dispersion liquid may be prepared by adding a composition, preliminarily prepared by mixing the pigment and a pigment dispersant, to an organic solvent (or vehicle) described later for dispersion. The vehicle herein refers to a portion of medium allowing the pigments to disperse therein when the coating material is in a liquid state, and includes a liquidous portion (binder) binding with the pigment to thereby solidify a coated layerwand a component (organic solvent) dissolving and diluting the liquidous portion. There is no special limitation on dispersion machine used for dispersing the pigment, and any known dispersers described in "Ganryo no Jiten (A Cyclopedia of Pigments)", First Edition, written by Kunizo Asakura, published by Asakura Shoten, 2000, p. 438, such as kneader, roll mill, attoritor, super mill, dissolver, homomixer, sand mill and the like, are applicable. It is also allowable to finely grind the pigment based on frictional force, making use of mechanical grinding described on p. 310 of the same literature.

The colorant (pigment) used in the present invention preferably has a number-averaged grain size of 0.001 to 0.1 µm, and more preferably 0.01 to 0.08 µm. A number-averaged grain size of less than 0.001 µm makes the pigment more likely to coagulate due to increased surface energy, makes the dispersion difficult, and also makes it difficult to keep the dispersion state stable. A number-averaged grain size exceeding 0.1 µm undesirably causes pigment-induced canceling of polarization, and degrades the contrast. It is to be noted that the "grain size" herein means the diameter of a circle having an area equivalent to that of the grain observed under an electron microscope, and that the "number-averaged grain size" means an average value of such grain sizes obtained from 100 grains.

The contrast of the colored pixel can be improved by reducing the grain size of the dispersed pigment. Reduction in the grain size can be achieved by adjusting the dispersion time of the pigment dispersion liquid. Any known dispersion machine described in the above can be used for the dispersion. The dispersion time is preferably 10 to 30 hours, more preferably 18 to 30 hours, and most preferably 24 to 30 hours. A dispersion time of less than 10 hours may result in pigment-induced canceling of polarization due to large grain size of the pigment, and lowering in the contrast. On the other hand, a dispersion time exceeding 30 hours may increase the viscosity of the dispersion liquid, and may make the coating difficult. Difference in the contrast of two or more colored pixels can be suppressed to 600 or smaller, by adjusting the grain size to thereby achieve a desired contrast.

The contrast of the individual colored pixels of the color filter formed by using the above-described photosensitive polymer layer is preferably 2000 or larger, more preferably 2800 or larger, still more preferably 3000 or larger, and most preferably 3400 or larger. If the contrast of the individual colored pixels composing the color filter is less than 2000, images observed on the liquid crystal display device having the color filter incorporated therein generally give a whitish impression, which is not comfortable to watch, and is undesirable. Difference in the contrast among the individual colored pixels is preferably suppressed to 600 or smaller, more preferably 410 or smaller, still more preferably 350 or smaller, and most preferably 200 or smaller. A difference in the contrast of the individual pixels of 600 or smaller makes light leakage from the individual colored pixel portions in the black state not so largely different from each other, and this is desirable in terms of ensuring a good color balance in the black state.

In this specification, "contrast of the colored pixel" means the contrast individually evaluated for each of the colors R, G and B composing the color filter. A method of measuring the contrast is as follows. Polarizer plates are stacked on a sample to be measured on both sides thereof, while aligning the direction of polarization of the polarizer plates in parallel with each other, the sample is then illuminated by a back light from one polarizer plate side, and luminance Y1 of light transmitted through the other polarizer plate is measured. Next, the polarizer plates are orthogonally crossed, the sample is then illuminated by the back light from one polarizer plate sides, and luminance Y2 of light transmitted through the other is measured. The contrast is expressed as Y1/Y2 using thus obtained values of measurement. It is to be noted that the polarizer plates used for the contrast measurement are the same as those used for the liquid crystal display device using the color filter.

The color filter formed using the photosensitive polymer layer preferably contain an appropriate surfactant in such colored polymer composition, from the viewpoint of effectively preventing non-uniformity in display (non-uniformity in color due to variation in the film thickness). Any surfactants are applicable so far as they are miscible with the photosensitive polymer composition. Surfactants preferably applicable to the present invention include those disclosed in paragraphs [0090] to [0091] in Japanese Laid-Open Patent Publication "Tokkai" No. 2003-337424, paragraphs [0092] to [0093] in Japanese Laid-Open Patent Publication "Tokkai" No. 2003-177522, paragraphs [0094] to [0095] in Japanese Laid-Open Patent Publication "Tokkai" No. 2003-177523, paragraphs [0096] to [0097] in Japanese Laid-Open Patent Publication "Tokkai" No. 2003-177521, paragraphs [0098] to [0099] in Japanese Laid-Open Patent Publication "Tokkai" No. 2003-177519, paragraphs [0100] to [0101] in Japanese Laid-Open Patent Publication "Tokkai" No. 2003-177520, paragraphs [0102] to [0103] in Japanese Laid-Open Patent Publication "Tokkaihei" No. 11-133600 and those disclosed as the invention in Japanese Laid-Open Patent Publication "Tokkaihei" No. 6-16684. In order to obtain higher effects, it is preferable to use any of fluorine-containing surfactants and/or silicon-base surfactants (fluorine-containing surfactant, or, silicon-base surfactant, and surfactant containing both of fluorine atom and silicon atom), or two or more surfactants selected therefrom, wherein the fluorine-containing surfactant is most preferable. When the fluorine-containing surfactant is used, the number of fluorine atoms contained in the fluorine-containing substituents in one surfactant molecule is preferably 1 to 38, more preferably 5 to 25, and most preferably 7 to 20. Too large number of fluorine atoms degrades the solubility in general fluorine-free solvents and thus is undesirable. Too small number of fluorine atoms does not provide effects of improving the non-uniformity and thus is undesirable.

Particularly preferable surfactants can be those containing a copolymer which includes the monomers represented by the formulae (a) and (b) below, having a ratio of mass of formula (a)/formula (b) of 20/80 to 60/40:

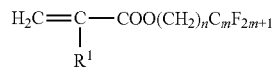

Formula (a)

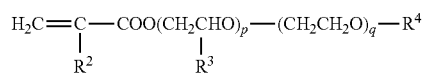

Formula (b)

In the formulas, $R^1$, $R^2$ and $R^3$ independently represent a hydrogen atom or a methyl group, $R^4$ represents a hydrogen atom or an alkyl group having the number of carbon atoms of 1 to 5. n represents an integer from 1 to 18, and m represents an integer from 2 to 14. p and q represents integers from 0 to 18, excluding the case where both of p and q are 0.

It is to be defined now that a monomer represented by the formula (a) and a monomer represented by the formula (b) of the particularly preferable surfactants are denoted as monomer (a) and monomer (b), respectively. $C_mF_{2m+1}$ in the formula (a) may be straight-chained or branched. m represents an integer from 2 to 14, and is preferably an integer from 4 to 12. Content of $C_mF_{2m+1}$ is preferably 20 to 70% by weight, and more preferably 40 to 60% by weight, of the monomer (a). $R^1$ represents a hydrogen atom or a methyl group. n represents 1 to 18, and more preferably 2 to 10. $R^2$ and $R^3$ in the formula (b) independently represent a hydrogen atom or a methyl group, and $R^4$ represents a hydrogen atom or an alkyl group having the number of carbon atoms of 1 to 5. p and q respectively represent integers of 0 to 18, excluding the case where both of p and q are 0. p and q are preferably 2 to 8.

The monomer (a) contained in one particularly preferable surfactant molecule may be those having the same structure, or having structures differing within the above-defined range. The same can also be applied to the monomer (b).

The weight-average molecular weight Mw of a particularly preferable surfactant preferably falls in the range from 1000 to 40000, and more preferably from 5000 to 20000. The surfactant characteristically contains a copolymer composed of the monomers expressed by the formula (a) and the formula (b), and having a ratio of mass of monomer (a)/monomer (b) of 20/80 to 60/40. Hundred parts by weight of a particularly preferable surfactant is preferably composed of 20 to 60 parts by weight of the monomer (a), 80 to 40 parts by weight of the monomer (b), and residual parts by weight of other arbitrary monomers, and more preferably 25 to 60 parts by weight of the monomer (a), 60 to 40 parts by weight of the monomer (b), and residual parts by weight of other arbitrary monomer.

Copolymerizable monomers other than the monomers (a) and (b) include styrene and derivatives or substituted compounds thereof including styrene, vinyltoluene, α-methylstyrene, 2-methylstyrene, chlorostyrene, vinylbenzoic acid, sodium vinylbenzene sulfonate, and aminostyrene; dienes such as butadiene and isoprene; and vinyl-base monomers such as acrylonitrile, vinylethers, methacrylic acid, acrylic acid, itaconic acid, crotonic acid, maleic acid, partially esterified maleic acid, styrene sulfonic acid, maleic anhydride, cinnamic acid, vinyl chloride and vinyl acetate.

A particularly preferable surfactant is a copolymer of the monomer (a), monomer (b) and so forth, allowing monomer sequence of random or ordered, such as forming a block or graft, while being not specifically limited. A particularly preferable surfactant can use two or more monomers differing in the molecular structure and/or monomer composition in a mixed manner.

Content of the surfactant is preferably adjusted to 0.01 to 10% by weight to the total amount of solid components of the photosensitive polymer layer, and more preferably to 0.1 to 7% by weight. The surfactant contains predetermined amounts of a surfactant of a specific structure, ethylene oxide group and polypropylene oxide group. Therefore, addition of the surfactant at an amount within a specific range to the photosensitive polymer layer enables non-uniformity to reduce in the display on the liquid crystal display device provided with the photosensitive polymer layer. When the content is less than 0.01% by weight to the total amount of solid components, the non-uniformity in the display is not reduced, and when the content exceeds 10% by weight, the effect of reducing the non-uniformity in the display is saturated. Production of the color filter while adding the particularly preferable surfactant described in the above to the photosensitive polymer layer is preferable in terms of improving the non-uniformity in the display.

The commercial surfactants listed below may also be used directly. As applicable commercial surfactants, examples include fluorine-containing surfactants such as Eftop EF301, EF303 (products of Shin-Akita Kasei K.K.), Florade FC430, 431 (products of Sumitomo 3M Co., Ltd.), Megafac F171, F173, F176, F189, R08 (products of Dainippon Ink and Chemicals, Inc.), Surflon S-382, SC101, 102, 103, 104, 105, 106 (products of Asahi Glass Co., Ltd.), and silicon-base surfactants. Also polysiloxane polymer KP-341 (product of Shin-Etsu Chemical Co., Ltd.) and Troysol S-366 (product of Troy Chemical Industries, Inc.) may be used as the silicon-base surfactants.

[Other Layers]

Between the support and the optically anisotropic layer of the transfer material of the present invention, a thermoplastic polymer layer to control mechanical characteristics and conformity to irregularity may be preferably provided. Components used for the thermoplastic polymer layer are preferably organic polymer substances described in Japanese Laid-Open Patent Publication "Tokkaihei" No. 5-72724, and are particularly preferably selected from organic polymer substances having softening points, measured by the Vicat method (more specifically, a method of measuring softening point of polymer conforming to ASTMD1235 authorized by American Society For Testing and Materials) of approximately 80° C. or below. More specifically, organic polymers such as polyolefins including polyethylene and polypropylene; ethylene copolymers including those composed of ethylene and vinyl acetate or saponified product thereof, or composed of ethylene and acrylate ester or saponified product thereof; polyvinyl chloride; vinyl chloride copolymers including those composed of vinyl chloride and vinyl acetate or saponified product thereof; polyvinylidene chloride; vinylidene chloride copolymer; polystyrene; styrene copolymers including those composed of styrene and (meth)acrylate ester or saponified product thereof; polyvinyl toluene; vinyltoluene copolymers such as being composed of vinyl toluene and (meth)acrylate ester or saponified product thereof; poly(meth)acrylate ester; (meth)acrylate ester copolymers including those composed of butyl(meth)acrylate and vinyl acetate; vinyl acetate copolymers; and polyamide polymers including nylon, copolymerized nylon, N-alkoxymethylated nylon and N-dimethylamino-substituted nylon.

The transfer material of the present invention preferably has an intermediate layer for the purpose of preventing mixing of the components during coating of a plurality of layers and during storage after the coating. As the intermediate layer, the oxygen shut-off film having an oxygen shut-off function described as a "separation layer" in Japanese Laid-Open Patent Publication "Tokkaihei" No. 5-72724 is preferably used, by which sensitivity during the light exposure increases, and this improves the productivity. Any films showing a low oxygen permeability and being dispersible and soluble to water or aqueous alkaline solution are preferably used as the oxygen shut-off film, and such films can properly be selected from any known films. Of these, particularly preferable is a combination of polyvinyl alcohol and polyvinyl pyrrolidone.

A thermoplastic polymer layer or the intermediate layer as above may also be used as the alignment layer. In particular, a combination of polyvinyl alcohol and polyvinyl pyrrolidone preferably used as the intermediate layer is useful also as the alignment layer, and it is preferable to configure the intermediate layer and the alignment layer as a single layer.

On the polymer layer, it is preferable to provide a thin protective film for the purpose of preventing contamination or damage during storage. The protective film may be composed of a material same as, or similar to, that used for the temporary support, but must be readily separable from the polymer layer. Preferable examples of material composing the protective film include silicon paper, polyolefin sheet and polytetrafluoroethylene sheet.

The individual layers of the optically anisotropic layer, photosensitive polymer layer, and optionally-formed alignment layer, thermoplastic polymer layer and intermediate layer can be formed by coating such as dip coating, air knife coating, curtain coating, roller coating, wire bar coating, gravure coating and extrusion coating (U.S. Pat. No. 2,681,294). Two or more layers may be coated simultaneously. Methods of simultaneous coating is described in U.S. Pat. Nos. 2,761,791, 2,941,898, 3,508,947, 3,526,528, and in "Kotingu Kogaku (Coating Engineering), written by Yuji Harazaki, p. 253, published by Asakura Shoten (1973).

[Method of Forming Optically Anisotropic Layer Using Transfer Material]

Methods of forming the transfer material of the present invention on the target transfer substrate are not specifically limited, so far as the optically anisotropic layer and the photosensitive polymer layer can be transferred onto the substrate at the same time. For example, the transfer material of the present invention in a film form may be attached to the substrate so that the surface of the photosensitive polymer layer is faced to the surface of the substrate, by pressing with or without heating with rollers or flat plates of a laminator. Specific examples of the laminator and the method of lamination include those described in Japanese Laid-Open Patent Publication Nos. 7-110575, 11-77942, 2000-334836 and 2002-148794, wherein the method described in Japanese Laid-Open Patent Publication No. 7-110575 is preferable in terms of low contamination. The support may be separated thereafter, and it is also allowable to form other layer, such as electrode layers, on the surface of the optically anisotropic layer exposed after the separation.

The substrate which is a target for transferring of the transfer material of the present invention can be a transparent substrate, which is exemplified for example by known glasses such as soda glass sheet having a silicon oxide film formed on the surface thereof, low-expansion glass and non-alkali glass; or plastic film. The target for transferring may be a transparent support having an optically anisotropic layer formed thereon in a non-patterned manner. The target for transferring can be improved in the adhesiveness with the photosensitive polymer layer by being preliminarily subjected to a coupling treatment. The coupling treatment is preferably carried out by using the method described in Japanese Laid-Open Patent Publication "Tokkai" No. 2000-39033. The thickness of the substrate is preferably 700 to 1200 μm in general, although being not specifically limited.

When a patterned optically anisotropic layer is prepared, particularly a color filter together with an optically anisotropic layer is prepared, light exposure may be carried out by disposing a predetermined mask over the photosensitive polymer layer formed on the target for transferring and illuminating the photosensitive polymer layer from above the mask, or by focusing laser beam or electron beam to predetermined regions without using the mask. Subsequently, development with a developing solution may be carried out. In the transfer material of the present invention, the reactive group present in the optically anisotropic layer and the reactive group present in the photosensitive polymer layer bond by a reaction, resulting in adhesion of the optically anisotropic layer and the photosensitive polymer layer only in the exposed parts. As a result, the non-exposed parts of the optically anisotropic layer separate from the photosensitive polymer layer in the development, which promotes the development only of the non-exposed parts of the photosensitive polymer layer, and improve the accuracy of patterning.

When a color filter with an optically anisotropic layer is prepared, a pattern of one color, for example R, is formed by a development on a substrate, wherein a stack of a colored polymer layer, such as a red (R) polymer layer, and the optically anisotropic layer is disposed at predetermined locations. By repeating the same process steps using the transfer materials each having the green (G) polymer layer and blue (B) polymer layer, the color filter with the optically anisotropic layer of the present invention can be obtained, which is configured as having the colored polymer layer and the optically anisotropic layer equally patterned with the RGB pattern of the colored polymer layer. A light source for the light exposure herein can properly be selected from those capable of illuminating light having wavelength ranges capable of curing the polymer layer (365 nm, 405 nm, for example). Specific examples of the light source include extra-high voltage mercury lamp, high voltage mercury lamp and metal halide lamp. Energy of exposure generally falls in the range from about 5 to 200 $mJ/cm^2$, preferably from about 10 to 100 $mJ/cm^2$.

A developing solution used in the development step after the light exposure is not specifically limited, allowing use of any known developing solution such as those described in Japanese Laid-Open Patent Publication "Tokkaihei" No. 5-72724. The developing solution may preferably allow the polymer layer to show a dissolution-type developing behavior, and preferably contain, for example, a compound having pKa=7 to 13 to a concentration of 0.05 to 5 mol/L. A small amount of an organic solvent miscible with water may be further added to the developing solution. Examples of the organic solvent miscible with water include methanol, ethanol, 2-propanol, 1-propanol, butanol, diacetone alcohol, ethylene glycol monomethyl ether, ethylene glycol monoethyl ether, ethylene glycol mono-butyl ether, benzyl alcohol, acetone, methyl ethyl ketone, cyclohexanone, ε-caprolactone, γ-butyrolactone, dimethylformamide, dimethyl acetamide, hexamethyl phosphorylamide, ethyl lactate, methyl lactate, ε-caprolactam, N-methylpyrrolidone, tetrahydrofuran, and acetonitrile. The concentration of the organic solvent is preferably adjusted to 0.1% by weight to 30% by weight.

The above-described developing solution can be added with any known surfactant. The concentration of the surfactant is preferably adjusted to 0.01% by weight to 10% by weight.

Methods of the development may be any of known methods such as paddle development, shower development, shower-and-spin development and dipping development. Non-cured portion of the polymer layer after the light exposure can be removed by showering a developing solution. The thermoplastic polymer layer, the intermediate layer and the like are preferably removed before the development, typically by spraying an alkaline solution having only a small dissolving power against the polymer layer by using a shower. It is also preferable to remove the development residue after the development, by spraying a shower of cleaning agent, and typically by brushing at the same time. The developing solution may be any known ones, and preferable examples include "T-SD1" (trade name; product of Fuji Photo Film Co., Ltd.) containing phosphate, silicate, nonionic surfactant, defoaming agent and stabilizing agent; or "T-SD2" (trade name; product of Fuji Photo Film Co., Ltd.) containing sodium carbonate and phenoxyoxyethylene-base surfactant. The temperature of the developing solution is preferably 20° C. to 40° C., and pH of the developing solution is preferably 8 to 13.

In fabrication of the color filter, it is preferable for the purpose of reducing cost to form a base by stacking the colored polymer composition for forming the color filter, to form the transparent electrode thereon, and to form, if necessary, spacers by stacking thereon projections for divisional orientation, as described in Japanese Laid-Open Patent Publication "Tokkaihei" No. 11-248921.

EXAMPLES

Paragraphs below will more specifically describe the present invention referring to Examples. Any materials, reagents, amount and ratio of use and operations shown in Examples may appropriately be modified without departing from the spirit of the present invention. It is therefore understood that the present invention is by no means limited to specific Examples below.

(Preparation of Coating Liquid TP-1 for Thermoplastic Polymer Layer)

The composition below was prepared, filtered through a polypropylene filter having a pore size of 30 μm, and the filtrate was used as coating liquid TP-1 for forming an alignment layer.

| Composition of Coating Liquid for forming Thermoplastic Polymer Layer | (% by weight) |
|---|---|
| methyl methacrylate/2-ethylhexyl acrylate/benzyl methacrylate/methacrylate copolymer (copolymerization ratio (molar ratio) = 55/30/10/5, weight-average molecular weight = 100,000, Tg ≈ 70° C.) | 5.89 |
| styrene/acrylic acid copolymer (copolymerization ratio (molar ratio) = 65/35, weight-average molecular weight = 10,000, Tg ≈ 100° C.) | 13.74 |
| BPE-500 (from Shin-Nakamura Chemical Co., Ltd.) | 9.20 |
| Megafac F-780-F (from Dainippon Ink and Chemicals, Inc.) | 0.55 |
| methanol | 11.22 |
| propylene glycol monomethyl ether acetate | 6.43 |
| methyl ethyl ketone | 52.97 |

(Preparation of Coating Liquid AL-1 for Intermediate Layer/Alignment Layer)

The composition below was prepared, filtered through a polypropylene filter having a pore size of 30 μm, and the filtrate was used as coating liquid AL-1 for forming an intermediate layer/alignment layer.

| Composition of Coating Liquid AL-1 for Intermediate Layer/Alignment layer | (% by weight) |
|---|---|
| polyvinyl alcohol (PVA205, from Kuraray Co., Ltd.) | 3.21 |
| polyvinylpyrrolidone (Luvitec K30, from BASF) | 1.48 |
| distilled water | 52.1 |
| methanol | 43.21 |

(Preparation of Coating Liquid LC-R1 for Optically Anisotropic Layer)

The composition below was prepared, filtered through a polypropylene filter having a pore size of 0.2 μm, and the filtrates were used as coating liquid LC-R1 for forming an optically anisotropic layer.

LC-1-1 was synthesized according to the method described in Tetrahedron Lett., Vol. 43, p. 6793 (2002). LC-1-2 was synthesized according to the method described in EP1388538A1, p. 21.

| Composition of Coating Liquid for Optically Anisotropic Layer | (% by weight) |
|---|---|
| rod-like liquid crystal (Paliocolor LC242, from BASF Japan) | 28.0 |
| chiral agent (Paliocolor LC756, from BASF Japan) | 3.32 |
| 4,4'-azoxydianisole | 0.52 |
| glycidyl methacrylate | 0.70 |
| horizontal orientation agent (LC-1-1) | 0.10 |
| photopolymerization initiator (LC-1-2) | 1.36 |
| methyl ethyl ketone | 66.0 |

(LC-1-1)

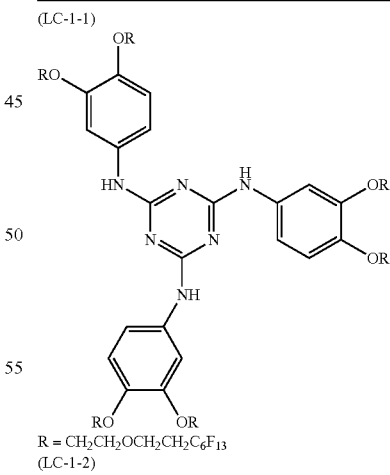

R = $CH_2CH_2OCH_2CH_2C_6F_{13}$ (LC-1-2)

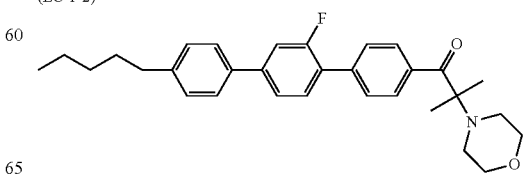

(Preparation of Coating Liquid LC-G1 for Optically Anisotropic Layer)

The composition below was prepared, filtered through a polypropylene filter having a pore size of 0.2 μm, and the filtrates were used as coating liquid LC-G1 for forming an optically anisotropic layer.

| Composition of Coating Liquid for Optically Anisotropic Layer | (% by weight) |
|---|---|
| rod-like liquid crystal (Paliocolor LC242, from BASF Japan) | 27.75 |
| chiral agent (Paliocolor LC756, from BASF Japan) | 3.27 |
| 4,4'-azoxydianisol | 0.27 |
| glycidyl methacrylate | 0.70 |
| horizontal orientation agent (LC-1-1) | 0.10 |
| photopolymerization initiator (LC-1-2) | 1.34 |
| methyl ethyl ketone | 66.57 |

(Preparation of Coating Liquid LC-B1 for Optically Anisotropic Layer)

The composition below was prepared, filtered through a polypropylene filter having a pore size of 0.2 μm, and the filtrates were used as coating liquid LC-B1 for forming an optically anisotropic layer.

| Composition of Coating Liquid for Optically Anisotropic Layer | (% by weight) |
|---|---|
| rod-like liquid crystal (Paliocolor LC242, from BASF Japan) | 28.08 |
| chiral agent (Paliocolor LC756, from BASF Japan) | 3.30 |
| 4,4'-azoxydianisole | 0.03 |
| glycidyl methacrylate | 0.70 |
| horizontal orientation agent (LC-1-1) | 0.10 |
| photopolymerization initiator (LC-1-2) | 1.34 |
| methyl ethyl ketone | 66.45 |

(Preparation of Coating Liquid LC-R2 for Optically Anisotropic Layer)

The composition below was prepared, filtered through a polypropylene filter having a pore size of 0.2 μm, and the filtrates were used as coating liquid LC-R2 for forming an optically anisotropic layer.

| Composition of Coating Liquid for Optically Anisotropic Layer | (% by weight) |
|---|---|
| rod-like liquid crystal (Paliocolor LC242, from BASF Japan) | 28.62 |
| chiral agent (Paliocolor LC756, from BASF Japan) | 3.40 |
| 4,4'-azoxydianisole | 0.52 |
| horizontal orientation agent (LC-1-1) | 0.10 |
| photopolymerization initiator (LC-1-2) | 1.36 |
| methyl ethyl ketone | 66.0 |

(Preparation of Coating Liquid LC-G2 for Optically Anisotropic Layer)

The composition below was prepared, filtered through a polypropylene filter having a pore size of 0.2 μm, and the filtrates were used as coating liquid LC-G2 for forming an optically anisotropic layer.

| Composition of Coating Liquid for Optically Anisotropic Layer | (% by weight) |
|---|---|
| rod-like liquid crystal (Paliocolor LC242, from BASF Japan) | 28.38 |
| chiral agent (Paliocolor LC756, from BASF Japan) | 3.34 |
| 4,4'-azoxydianisol | 0.27 |
| horizontal orientation agent (LC-1-1) | 0.10 |
| photopolymerization initiator (LC-1-2) | 1.34 |
| methyl ethyl ketone | 66.57 |

(Preparation of Coating Liquid LC-B2 for Optically Anisotropic Layer)

The composition below was prepared, filtered through a polypropylene filter having a pore size of 0.2 μm, and the filtrates were used as coating liquid LC-B2 for forming an optically anisotropic layer.

| Composition of Coating Liquid for Optically Anisotropic Layer | (% by weight) |
|---|---|
| rod-like liquid crystal (Paliocolor LC242, from BASF Japan) | 28.72 |
| chiral agent (Paliocolor LC756, from BASF Japan) | 3.36 |
| 4,4'-azoxydianisole | 0.03 |
| horizontal orientation agent (LC-1-1) | 0.10 |
| photopolymerization initiator (LC-1-2) | 1.34 |
| methyl ethyl ketone | 66.45 |

(Preparation of Coating Liquid LC-2 for Optically Anisotropic Layer)

The composition below was prepared, filtered through a polypropylene filter having a pore size of 0.2 μm, and the filtrate was used as coating liquids LC-2 for forming the optically anisotropic layer. LC-2-1 was synthesized according to a method described in Japanese Laid-Open Patent Publication "Tokkai" No. 2001-166147. LC-2-2 was synthesized by dissolving a commercial hydroxyethyl methacrylate, acrylic acid, and M5610 (product of Daikin Industries, Ltd.) in a ratio by weight of 15/5/80 into methyl ethyl ketone (concentration 40%), and the mixture was allowed to polymerize using V-601 (product of Wako Pure Chemical Industries, Ltd.) as a polymerization initiator. LC-2-3 was synthesized by first introducing octyloxybenzoic acid (product of Kanto Chemical Co., Inc.) into an excessive hydroquinone (product of Wako Pure Chemical Industries, Ltd.) based on the mixed acid anhydride process so as to obtain monoacyl phenol compound. Next, methyl p-hydroxybenzoate was converted to a hydroxylethyl compound using ethylene carbonate, the resultant ester is hydrolyzed, and brominated with hydrobromic acid to obtain 2-bromoethyloxybenzoic acid. Two these compounds were then esterified by the mixed acid anhydride process to obtain a diester compound, and the product was then converted to a quaternary compound using dimethylaminopyridine, to thereby obtain LC-2-3 as an onium salt.

| Composition of Coating Liquid LC-2 for Optically Anisotropic Layer | (% by weight) |
|---|---|
| discotic liquid crystalline compound (LC-2-1) | 30.0 |
| ethylene oxide-modified trimethylol propane triacrylate (V#360, from Osaka Organic Chemical Industry, Ltd.) | 3.3 |
| photopolymerization initiator (Irgacure 907, from Ciba Specialty Chemicals) | 1.0 |
| sensitizer (Kayacure DETX, from Nippon Kayaku Co., Ltd.) | 0.33 |
| glycidyl methacrylate | 0.70 |
| vertical alignment agent at the air interface side (LC-2-2) | 0.12 |
| vertical alignment agent at the alignment layer side (LC-2-3) | 0.15 |
| methyl ethyl ketone | 64.4 |

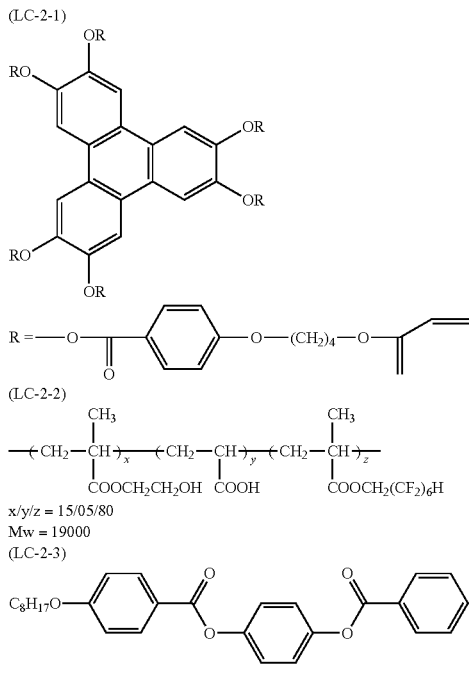

(LC-2-2)

x/y/z = 15/05/80
Mw = 19000

(LC-2-3)

(Preparation of Coating Liquid PP-1 for Photosensitive Polymer Layer)

The composition below was prepared, filtered through a polypropylene filter having a pore size of 0.2 μm, and the filtrate was used as coating liquids PP-1 for forming a photosensitive polymer layer.

| Composition of Coating Liquid PP-1 for Photosensitive polymer Layer | (% by weight) |
|---|---|
| random copolymer of benzyl methacrylate/methacrylic acid (72/28 by molar ratio, weight-average molecular weight = 37,000) | 5.0 |
| random copolymer of benzyl methacrylate/methacrylic acid (78/22 by molar ratio, weight-average molecular weight = 40,000) | 2.45 |
| KAYARAD DPHA (from Nippon Kayaku Co., Ltd.) | 3.2 |
| radical polymerization initiator (Irgacure 907, from Ciba Specialty Chemicals) | 0.75 |
| sensitizer (Kayacure DETX, from Nippon Kayaku Co., Ltd.) | 0.25 |
| cationic polymerization initiator (diphenyliodonium hexafluorophosphate, from Tokyo Kasei) | 0.1 |
| propylene glycol monomethyl ether acetate | 27.0 |
| methyl ethyl ketone | 53.0 |
| cyclohexanone | 9.1 |
| Megafac F-176PF (from Dainippon Ink and Chemicals, Inc.) | 0.05 |

(Preparation of Coating Liquid PP-2 for Photosensitive Polymer Layer)

The composition below was prepared, filtered through a polypropylene filter having a pore size of 0.2 μm, and the filtrate was used as coating liquids PP-2 for forming a photosensitive polymer layer.

| Composition of Coating Liquid PP-1 for Photosensitive polymer Layer | (% by weight) |
|---|---|
| random copolymer of benzyl methacrylate/methacrylic acid (72/28 by molar ratio, weight-average molecular weight = 37,000) | 5.0 |
| random copolymer of benzyl methacrylate/methacrylic acid (78/22 by molar ratio, weight-average molecular weight = 40,000) | 2.45 |
| KAYARAD DPHA (from Nippon Kayaku Co., Ltd.) | 3.2 |
| radical polymerization initiator (Irgacure 907, from Ciba Specialty Chemicals) | 0.75 |
| sensitizer (Kayacure DETX, from Nippon Kayaku Co., Ltd.) | 0.25 |
| propylene glycol monomethyl ether acetate | 27.0 |
| methyl ethyl ketone | 53.0 |
| cyclohexanone | 9.2 |
| Megafac F-176PF (from Dainippon Ink and Chemicals, Inc.) | 0.05 |

Next paragraphs will describe methods of preparing coating liquids for photosensitive polymer layers. Table 2 shows compositions of the individual coating liquids for forming the photosensitive polymer layers.

TABLE 2

| (% by weight) | PP-K1 | PP-R1 | PP-G1 | PP-B1 |
|---|---|---|---|---|
| K pigment dispersion | 25 | — | — | — |
| R pigment dispersion-1 | — | 44 | — | — |
| R pigment dispersion-2 | — | 5.0 | — | — |
| G pigment dispersion | — | — | 24 | — |
| CF Yellow EC3393 (from Mikuni Color Works, Ltd.) | — | — | 13 | — |
| CF Blue EC3357 (from Mikuni Color Works, Ltd.) | — | — | — | 7.2 |
| CF Blue EC3383 (from Mikuni Color Works, Ltd.) | — | — | — | 13 |
| propylene glycol monomethyl ether acetate (PGMEA) | 8.0 | 7.6 | 29 | 23 |
| methyl ethyl ketone | 53.494 | 37.412 | 25.115 | 35.78 |
| cyclohexanone | — | — | 1.3 | — |
| binder 1 | 9.0 | — | 2.9 | — |
| binder 2 | — | 0.7 | — | — |
| binder 3 | — | — | — | 16.9 |
| DPHA solution | 4.2 | 4.4 | 4.3 | 3.8 |
| 2-trichloromethyl-5-(p-styrylstyryl)-1,3,4-oxadiazole | — | 0.14 | 0.15 | 0.15 |
| 2,4-bis(trichloromethyl)-6-[4-(N,N-diethoxycarbonylmethyl)-3-bromophenyl]-s-triazine | 0.160 | 0.058 | 0.060 | — |
| phenothiazine | — | 0.010 | 0.005 | 0.020 |
| hydroquionone monomethyl ether | 0.002 | — | — | — |
| diphenyliodonium hexafluorophosphate (from Tokyo Kasei) | 0.1 | 0.1 | 0.1 | 0.1 |
| HIPLAAD ED152 (from Kusumoto Chemicals) | — | 0.52 | — | — |
| Megafac F-176PF (from Dainippon Ink and Chemicals, Inc.) | 0.044 | 0.060 | 0.070 | 0.050 |

Compositions listed in Table 1 are as follows.

[Composition of K Pigment Dispersion]

| Composition of K Pigment Dispersion | (%) |
|---|---|
| carbon black (Special Black 250, from Degussa) | 13.1 |
| 5-[3-oxo-2-[4-[3,5-bis(3-diethyl aminopropyl aminocarbonyl)phenyl]aminocarbonyl]phenylazo]-butyroylaminobenzimidazolone | 0.65 |
| random copolymer of benzyl methacrylate/methacrylic acid (72/28 by molar ratio, weight-average molecular weight = 37,000) | 6.72 |
| propylene glycol monomethyl ether acetate | 79.53 |

[Composition R Pigment Dispersion-1]

| Composition of R Pigment Dispersion-1 | (%) |
|---|---|
| C.I. Pigment Red 254 | 8.0 |
| 5-[3-oxo-2-[4-[3,5-bis(3-diethyl aminopropyl aminocarbonyl)phenyl]aminocarbonyl]phenylazo]-butyroylaminobenzimidazolone | 0.8 |
| random copolymer of benzyl methacrylate/methacrylic acid (72/28 by molar ratio, weight-average molecular weight = 37,000) | 8.0 |
| propylene glycol monomethyl ether acetate | 83.2 |

[Composition of R Pigment Dispersion-2]

| Composition of R Pigment Dispersion-2 | (%) |
|---|---|
| C.I. Pigment Red 177 | 18.0 |
| random copolymer of benzyl methacrylate/methacrylic acid (72/28 by molar ratio, weight-average molecular weight = 37,000) | 12.0 |
| propylene glycol monomethyl ether acetate | 70.0 |

[Composition of G Pigment Dispersion]

| Composition of G Pigment Dispersion | (%) |
|---|---|
| C.I. Pigment Green 36 | 18.0 |
| random copolymer of benzyl methacrylate/methacrylic acid (72/28 by molar ratio, weight-average molecular weight = 37,000) | 12.0 |
| cyclohexanone | 35.0 |
| propylene glycol monomethyl ether acetate | 35.0 |

[Composition of Binder 1]

| Composition of Binder 1 | (%) |
|---|---|
| random copolymer of benzyl methacrylate/methacrylic acid (78/22 by molar ratio, weight-average molecular weight = 40,000) | 27.0 |
| propylene glycol monomethyl ether acetate | 73.0 |

[Composition of Binder 2]

| Composition of Binder 2 | (%) |
|---|---|
| random copolymer of benzyl methacrylate/methacrylic acid/methyl methacrylate (38/25/37 by molar ratio, weight-average molecular weight = 30,000) | 27.0 |
| propylene glycol monomethyl ether acetate | 73.0 |

[Composition of Binder 3]

| Composition of Binder 3 | (%) |
|---|---|
| random copolymer of benzyl methacrylate/methacrylic acid/methyl methacrylate (36/22/42 by molar ratio, weight-average molecular weight = 30,000) | 27.0 |
| propylene glycol monomethyl ether acetate | 73.0 |

[Composition of DPHA]

| Composition of DPHA Solution | (%) |
|---|---|
| KAYARAD DPHA (from Nippon Kayaku Co., Ltd.) | 76.0 |
| propylene glycol monomethyl ether acetate | 24.0 |

(Preparation of Coating Liquid PP-K1 for Photosensitive Polymer Layer)

Coating liquid PP-K1 for the photosensitive polymer layer was obtained first by weighing K pigment dispersion and propyleneglycol monomethyl ether acetate listed in Table 2 according to the amounts listed therein, mixing them at 24° C.

(2° C.), stirring the mixture at 150 rpm for 10 minutes, then weighing methyl ethyl ketone, binder 1, hydroquinone monomethyl ether, DPHA solution, 2,4-bis(trichloromethyl)-6-[4-(N,N-diethoxycabonylmethyl)-3-bromophenyl]-s-triazine, and Megafac F-176PF according to the amounts listed in Table 1, adding them to the mixture in this order at 25° C. (±2° C.), and stirring the mixture at 40° C. (±2° C.) at 150 rpm for 30 minutes.

(Preparation of Coating Liquid PP-R1 for Photosensitive polymer Layer)

Coating liquid PP-R1 for the photosensitive polymer layer was obtained first by weighing R pigment dispersion-1, R pigment dispersion-2 and propylene glycol monomethyl ether acetate listed in Table 2 according to the amounts listed therein, mixing them at 24° C. (±2° C.), stirring the mixture at 150 rpm for 10 minutes, weighing methyl ethyl ketone, binder 2, DPHA solution, 2-trichloromethyl-5-(p-styrylstyryl)-1,3,4-oxadiazole, 2,4-bis(trichloromethyl)-6-[4-(N,N-diethoxycarbonylmethyl)-3-bromophenyl]-s-triazine, phenothiazine, and diphenyliodonium hexafluorophosphate according to the amounts listed in Table 2, adding them to the mixture in this order at 24° C. (±2° C.), stirring the mixture at 150 rpm for 10 minutes, weighing ED152 according to the amount listed in Table 2, adding it to the mixture at 24° C. (±2° C.), stirring the mixture at 150 rpm for 20 minutes, weighing Megafac F-176 PF according to the amount listed in Table 1, adding it to the mixture at 24° C. (±2° C.), stirring the mixture at 30 rpm for 30 minutes, and filtering the mixture through a #200 nylon mesh.

(Preparation of Coating Liquid PP-G1 for Photosensitive Polymer Layer)

Coating liquid PP-G1 for photosensitive polymer layer was obtained first by first weighing G pigment dispersion, CF Yellow EX3393 and propylene glycol monomethyl ether acetate according to the amounts listed in Table 1, mixing them at 24° C. (±2° C.), stirring the mixture at 150 rpm for 10 minutes, then weighing methyl ethyl ketone, cyclohexanone, binder 1, DPHA solution, 2-trichloromethyl-5-(p-styrylstyryl)-1,3,4-oxadiazole, 2,4-bis(trichloromethyl)-6-[4-(N,N-diethoxycarbonylmethyl)-3-bromophenyl]-s-triazine, phenothiazine, and diphenyliodonium hexafluorophosphate according to the amounts listed in Table 2, adding them to the mixture in this order at 24° C. (±2° C.), stirring the mixture at 150 rpm for 30 minutes, then weighing Megafac F-176 PF according to the amount listed in Table 2, adding it to the mixture at 24° C. (±2° C.), stirring the mixture at 30 rpm for 5 minutes, and filtering the mixture through a #200 nylon mesh.

(Preparation of Coating Liquid PP-B1 for Photosensitive polymer Layer)

Coating liquid PP-B1 for photosensitive polymer layer was obtained first by weighing CF Blue EX3357, CF Blue EX3383 and propylene glycol monomethyl ether acetate according to the amounts listed in Table 1, mixing them at 24° C. (±2° C.), stirring the mixture at 150 rpm for 10 minutes, then weighing methyl ethyl ketone, binder 3, DPHA solution, 2-trichloromethyl-5-(p-styrylstyryl)-1,3,4-oxadiazole, phenothiazine, and diphenyliodonium hexafluorophosphate according to the amounts listed in Table 2, adding them to the mixture in this order at 25° C. (±2° C.), stirring the mixture at 40° C. (±2° C.) at 150 rpm for 30 minutes, then weighing Megafac F-176 PF according to the amount listed in Table 2, adding it to the mixture at 24° C. (±2° C.), stirring the mixture at 30 rpm for 5 minutes, and filtering the mixture through a #200 nylon mesh.

(Preparation of Coating Liquid PP-R2, PP-G2, and PP-B2 for Photosensitive polymer Layer)

Coating liquids PP-R2, PP-G2, and PP-B2 for photosensitive polymer layer were prepared in a similar manner to that of PP-R12, PP-G1, and PP-B1, respectively, except that diphenyliodonium hexafluorophosphate was not used.

(Production of Photosensitive Polymer Transfer Material for Black Matrix)

To the surface of a temporary support formed of a 75-μm-thick polyethylene terephthalate film, coating liquid TP-1 was applied through a slit-formed nozzle, and dried. Next, coating liquid AL-1 was applied to thereto and dried. Photosensitive polymer composition PP-K1 was then applied thereto and dried, to thereby form on the temporary support a thermoplastic polymer layer having a thickness of 14.6 μm in a dried state, an intermediate layer having a dry film thickness of 1.6 μm, and a photosensitive polymer layer having a dry film thickness of 2.4 μm, and thereon a protective film (12-μm-thick polypropylene film) was attached under pressure. Photosensitive polymer transfer material K-1 for forming the black matrix, comprising the temporary support, the thermoplastic polymer layer and the intermediate layer (oxygen shut-off film) and the black (K) photosensitive polymer layer disposed in this order, was thus produced.

(Polarized Light UV Irradiation Apparatus POLUV-1)

A polarized UV irradiation apparatus was produced using a ultraviolet irradiation apparatus (Light Hammer 10, 240 W/cm, product of Fusion UV Systems) based on microwave UV light source, equipped with a D-Bulb showing a strong emission spectrum in the range from 350 to 400 nm, and disposing a wire-grid polarization filter (ProFlux PPL02 (high-transmissivity-type), product of Moxtek) 3 cm away from the irradiation plane thereof. Maximum illuminance of the apparatus was found to be 400 mW/cm$^2$.

(Production of Transfer Material of Example 1)

As a temporary support, a 75-μm thick polyethylene terephthalate film was used. The coating liquid TP-1 was applied to a surface of the film through a slit-formed nozzle, and dried, to form a thermoplastic polymer layer. Next, the coating liquid AL-1 was applied to a surface of the layer and dried, to form an alignment layer. The thickness of the thermoplastic polymer layer was found to be 14.6 μm, and the alignment layer found to be 1.6 μm. Next, thus-formed alignment layer was rubbed, and to a rubbed surface of the alignment layer, the coating liquid LC-G1 was applied using a #6 wire bar coater, the coated layer was dried at a film surface temperature of 95° C. for 2 minutes, to thereby form a layer of a uniform liquid crystal phase. Upon being matured, the layer was immediately irradiated by a polarized UV light (illuminance=200 mW/cm$^2$, illumination energy=200 mJ/cm$^2$) using POLUV-1 under a nitrogen atmosphere having an oxygen concentration of 0.3% or less, while aligning the transmission axis of the polarizer plate with the TD direction of the transparent support, so as to fix the optically anisotropic layer, to thereby form a 2.75-μm-thick optically anisotropic layer. Lastly, photosensitive polymer composition PP-1 was applied to a surface of the optically anisotropic layer and dried, to form a 0.5-μm-thick photosensitive polymer layer. The photosensitive polymer transfer material of Example 1 of the present invention was thus produced.

(Production of Transfer Material of Reference Example 1)

A photosensitive polymer transfer material of Reference Example 1 was prepared in a similar manner to that Example 1, except that LC-G2 was used instead of LC-G1, and PP-2 was used instead of PP-1.

(Production of Photosensitive Polymer Transfer Material for R, G, B Colors)

As a temporary support, a 75-μm-thick polyethylene terephthalate film was used. To a surface of the film, the coating liquid CU-1 was applied through a slit-formed nozzle, and dried, to form a thermoplastic polymer layer. Next, the coating liquid AL-1 was applied to a surface of the layer and dried, to form an alignment layer. The thickness of the thermoplastic polymer layer was found to be 14.6 μm, and the alignment layer found to be 1.6 μm. Next, thus-formed alignment layer was rubbed, and further to a rubbed surface of the alignment layer, the coating liquid LC-R1 was applied using a #6 wire bar coater. The coated layer was dried at a film surface temperature of 95° C. for 2 minutes, to thereby form a layer of a uniform liquid crystal phase. Upon being matured, the layer was immediately irradiated by a polarized UV light (illuminance=200 mW/cm$^2$, illumination energy=200 mJ/cm$^2$) using POLUV-1 under a nitrogen atmosphere having an oxygen concentration of 0.3% or less, while aligning the transmission axis of the polarizer plate with the TD direction of the transparent support, so as to fix the optically anisotropic layer, to thereby form a 2.8-μm-thick optically anisotropic layer. Lastly, photosensitive polymer composition PP-R1 was applied to a surface of the optically anisotropic layer, and dried to form a 1.6 μm-thick photosensitive polymer layer. The photosensitive polymer transfer material R-1 for R color according to Example 2 of the present invention was thus produced.

Also photosensitive polymer layer G-1 for G color of Example 3, and B-1 for B color of Example 4, were formed in a similar manner to that of Example 2, except that PP-G1 and PP-B1 were respectively used in place of PP-R1, and that LC-G1 and LC-B1 were applied to surfaces using #6 and #5 bars, respectively, for forming the optically anisotropic layers. The thicknesses of the optically anisotropic layers of G-1 and B-1 were found to be 2.75 μm and 2.3 μm, respectively.

(Production of Transfer Materials of Reference Examples 2 to 4)

Transfer materials R-2, G-2, and B-2, as Reference examples 2 to 4, respectively were produced in a manner similar to that of Examples 2 to 4, respectively, except that LC-R2, LC-G2, and LC-B2 was used instead of LC-R1, LC-G1, and LC-B1, respectively, and PP-R2, PP-G2, and PP-B2 was used instead of PP-R1, PP-G1, and PP-B1, respectively.

(Production of Transfer Material of Example 5)

The transfer material for use in production of an IPS-mode device according to Example 5 was produced in a similar manner to that of Example 1, except that coating liquid LC-2 was applied to a surface using a #3.4 wire bar coater, dried and matured under heating at 125° C. for 3 minutes, to thereby obtain a layer of a uniform liquid crystal phase, and that the coated layer was then illuminated in the air atmosphere by ultraviolet radiation with an illuminance of 400 mW/cm$^2$ and an irradiation energy of 300 mJ/cm$^2$, using a 160-W/cm, air-cooled metal halide lamp (product of Eyegraphics Co., Ltd.), so as to fix the optically anisotropic layer, to thereby obtain a 1.6-μm-thick optically anisotropic layer.

(Measurement of Retardation)

Frontal retardation Re(0) of each sample at an arbitrary wavelength λ, was measured using a fiber-type spectrometer based on the parallel Nicol method. And Re(40) and Re(−40) of each sample at an arbitrary wavelength λ, were measured while inclining the sample by ±40° using the slow axis as the axis of rotation in the same manner as the Frontal retardation Re(0). As for colors R, G and B, retardations were measured at wavelengths λ of 611 nm, 545 nm and 435 nm, respectively. Each sample was prepared by transferring all layers of the transfer material from on the temporary support to on a glass substrate. Retardation was determined only for the optically anisotropic layer causative of retardation, by correction using preliminarily-measured transmissivity data of the color filter. Results of the retardation measurements are shown in Table 3.

TABLE 3

| Sample | Re(0) | Re(40) | Re(−40) |
| --- | --- | --- | --- |
| Example 1 | 33.2 | 67.1 | 67.4 |
| Example 2 | 19.1 | 50.3 | 50.4 |
| Example 3 | 33.6 | 67.3 | 67.8 |
| Example 4 | 48.2 | 86.4 | 86.1 |
| Example 5 | 130.0 | 119.8 | 119.2 |
| Reference Example 1 | 34.0 | 67.8 | 68.1 |
| Reference Example 2 | 19.0 | 50.2 | 50.8 |
| Reference Example 3 | 33.0 | 67.0 | 67.1 |
| Reference Example 4 | 48.5 | 86.9 | 87.1 |

Example 1

Production of Color Filter)

Color filter was produced according to the method described below.

—Formation of Black (K) Pattern—

A non-alkali glass substrate was cleaned using a rotating nylon-haired brush while spraying a glass cleaner solution conditioned at 25° C. by a shower for 20 seconds. After showered with purified water, the substrate was sprayed with a silane coupling solution (0.3% aqueous solution of N-β-(aminoethyl)-γ-aminopropyl trimethoxysilane, trade name: KBM-603, Shin-Etsu Chemical Co., Ltd.) by a shower for 20 seconds, and then cleaned with a shower of purified water. The obtained substrate was then heated in a substrate preheating heater at 100° C. for 2 minutes.

The above-described photosensitive polymer transfer material K-1, after being separated from its protective film, was laminated onto the substrate preheated at 100° C. for 2 minutes, using a laminator (product of Hitachi Industries Co., Ltd. (model Lamic II)) under a rubber roller temperature of 130° C., a line pressure of 100 N/cm, and a travel speed of 2.2 m/min.

The photosensitive polymer layer, after the protective film was separated therefrom, was subjected to light exposure in a pattern-making manner using a proximity-type exposure apparatus having an extra-high-voltage mercury lamp (product of Hitachi Electronics Engineering Co., Ltd.), wherein the substrate and a mask (quartz-made photomask having an image pattern formed thereon) were vertically held while keeping a distance between the surface of the photomask and the photosensitive polymer layer of 200 μm away from each other, under an exposure energy of 70 mJ/cm$^2$.

Next, shower development was carried out using a triethanolamine-base developing solution (containing 2.5% of triethanolamine, a nonionic surfactant, and a polypropylene-base defoaming agent, trade name: T-PD1, product of Fuji Photo Film Co., Ltd.) at 30° C. for 50 seconds, under a flat nozzle pressure of 0.04 MPa, to thereby remove the thermoplastic polymer layer and the oxygen shut-off film.

Thereafter, the photosensitive polymer layer was developed using a shower of a sodium carbonate-base developing solution (containing 0.06 mol/L of sodium hydrogencarbonate, sodium carbonate of the same concentration, 1% of sodium dibutylnaphthalene sulfonate, anionic surfactant, defoaming agent and stabilizer, trade name: T-CD1, product of Fuji Photo Film Co., Ltd.) under a conical nozzle pressure of 0.15 MPa, to thereby obtain the patterned pixels.

Thereafter, residues were removed using a rotating nylon-haired brush while spraying a cleaning agent by a shower (containing phosphate, silicate, nonionic surfactant, defoaming agent and stabilizer, trade name: T-SD1 (product of Fuji Photo Film Co., Ltd.) under a conical nozzle pressure of 0.02 MPa, to thereby obtain the black (K) pattern. Thereafter, the substrate was further subjected to post-exposure from the polymer layer side thereof using an extra-high-voltage mercury lamp under exposure energy of 500 mJ/cm$^2$, and was then annealed at 220° C. for 15 minutes.

The substrate having the black (K) pattern formed thereon was again cleaned with the brush in the same manner as the above, showered with purified water, without using of a silane coupling solution, and then heated in a substrate preheating heater at 100° C. for 2 minutes.

—Formation of Red (R) Pixels—

Red (R) pixels and 28×28-μm square red (R) patterns were formed using the above-described photosensitive polymer transfer material R-1, on the substrate having the black (K) pattern already formed thereon, by the process steps similar to those for the above-described photosensitive polymer transfer material K-1. The exposure energy herein was adjusted to 40 mJ/cm$^2$. The substrate having the R pixels formed thereon was again cleaned with the brush as described in the above, washed with a shower of purified water, and heated in a preheating device at 100° C. for 2 minutes, without using a silane coupling solution.

—Formation of Green (G) Pixels—

Green (G) pixels were formed using the above-described photosensitive polymer transfer material G-1 on the substrate having the red (R) pixels already formed thereon, and green (G) patterns were formed so as to cover the entire portion of the red (R) patterns, by the process steps similar to those for the above-described photosensitive polymer transfer material K-1. The exposure energy herein was adjusted to 40 mJ/cm$^2$. The substrate having the R and G pixels formed thereon was again cleaned with the brush as described in the above, washed with a shower of purified water, and heated in a preheating device at 100° C. for 2 minutes, without using a silane coupling solution.

—Formation of Blue (B) Pixels—

Blue (B) pixels were formed using the above-described photosensitive polymer transfer material B-1 on the substrate having the red (R) pixels and the green (G) pixels already formed thereon, by the process steps similar to those for the above-described photosensitive polymer transfer material K-1. The exposure energy herein was adjusted to 30 mJ/cm$^2$. The substrate having the R, G and B pixels formed thereon was again cleaned with the brush as described in the above, washed with a shower of purified water, and heated in a preheating device at 100° C. for 2 minutes, without using a silane coupling solution.

The substrate having the R, G, B pixels and K patterns formed thereon was baked at 240° C. for 50 minutes, to thereby produce a desired Color Filter.

(Formation of Transparent Electrode)

On the above-produced color filter, a transparent electrode film was formed by sputtering of an ITO target.

(Production of Photosensitive Transfer Material for Projections)

To a surface of a temporary support formed of a 75-μm thick polyethylene terephthalate film, the coating liquid CU-1 was applied and dried, to thereby provide a thermoplastic polymer layer having a dry film thickness of 15 μm.

Next, coating liquid AL-1 for forming the intermediate layer/alignment layer was coated on the thermoplastic polymer layer, and dried, to thereby provide an intermediate layer having a dry film thickness of 1.6 μm.

To a surface of the intermediate layer, a coating liquid having a composition below was then applied and dried, to thereby provide a photosensitive polymer layer for forming projections for controlling liquid crystal orientation, having a dry film thickness of 2.0 μm.

| Composition of Coating Liquid for Projections | (%) |
|---|---|
| FH-2413F (from FUJIFILM Electronic Materials Co., Ltd.) | 53.3 |
| methyl ethyl ketone | 46.66 |
| Megafac F-176PF | 0.04 |

A 12-μm-thick polypropylene film was further attached as a cover film onto the surface of the photosensitive polymer layer, to thereby produce a transfer material having, on the temporary support, the thermoplastic polymer layer, the intermediate layer, the photosensitive polymer layer and the cover film stacked in this order.

(Formation of Projections)

The cover film was separated from the transfer material for forming projections produced in the above, the exposed surface of the photosensitive polymer layer is then opposed to the ITO-film-side surface of each of the product having the transparent electrode layer formed respectively on the color filter, and the stack was laminated using a laminator (product of Hitachi Industries Co., Ltd. (model Lamic II)) under a line pressure of 100 N/cm, at 130° C., and a travel speed of 2.2 m/min. Thereafter, only the temporary support of the transfer material was separated at the interface with the thermoplastic polymer layer, and removed The product up to this stage has, on the color-filter-side substrate, the photosensitive polymer layer, the intermediate layer and the thermoplastic polymer layer stacked in this order.

Next, a proximity exposure apparatus was disposed above the outermost thermoplastic polymer layer, so as to locate the photomask 100 μm away from the surface of the photosensitive polymer layer, and proximity light exposure was carried out through the photomask using an extra-high-voltage mercury lamp under an exposure energy of 70 mJ/cm$^2$. The substrate was then sprayed with a 1% aqueous triethanolamine solution at 30° C. for 30 seconds, using a shower developing apparatus, to thereby remove the thermoplastic polymer layer and the intermediate layer through dissolution. It was found that the photosensitive polymer layer at this stage was not substantially developed.

Next, the substrate was sprayed with an aqueous solution containing 0.085 mol/L of sodium carbonate, 0.085 mol/L of sodium hydrogencarbonate and 1% sodium dibutylnaphthalenesulfonate for development at 33° C. for 30 seconds, using a shower-type developing apparatus, to thereby remove unnecessary portion (uncured portion) of the photosensitive polymer layer. This resulted in formation of projections composed of the photosensitive polymer layer patterned according to a predetermined geometry, on the substrate on the color filter side thereof. Next, the substrate on the color filter side having the projections formed thereon was baked at 240° C. for 50 minutes, to thereby successfully form, on the substrate on the color filter side, the projections for controlling liquid crystal orientation, having a height of 1.5 μm and a semicircular section.

(Formation of Alignment Layer)

Further thereon, a polyimide orientation film was provided. An epoxy polymer sealing material containing spacer grains was printed at positions corresponding to the outer contour of the black matrix provided around the pixel group, and the color filter substrate and the opposing substrate (glass substrate having a TFT layer provided thereon) were attached under a pressure of 10 kg/cm. Thus attached glass substrates were then annealed at 150° C. for 90 minutes so as to allow the sealing material to cure, and thereby a stack of two glass substrates was obtained. The stack of the glass substrates was degassed in vacuo, and a liquid crystal was introduced therebetween by recovering the atmospheric pressure, to thereby obtain a liquid crystal cell. On both surfaces of the liquid crystal cell, polarizer plates HLC2-2518 from Sanritz Corporation were respectively attached.

(Production of VA-LCD of Example 6)

A three-band-phosphor-type white fluorescent lamp having an arbitrary color tone was produced as a cold-cathode-tube back light for color liquid crystal display device, using a phosphor composed of a 50:50 mixture on the weight basis of $BaMg_2Al_{16}O_{27}$:Eu,Mn and $LaPO_4$:Ce,Tb for green (G), $Y_2O_3$:Eu for red (R), and $BaMgAl_{10}O_{17}$:Eu for blue (B). The above-described liquid crystal cell having the polarizer plates bonded thereto was disposed on this back light, to thereby produce VA-LCD of Example 6, an embodiment shown in FIG. 3(b).

(Production of VA-LCD of Reference Example 5)

A VA-LCD of Reference Example 5 was produced in a similar manner to that of Example 6, except that the transfer materials R-2, G-2, and B-2 were used instead of R-1, G-1, and B-1, respectively.

(Production of VA-LCD of Example 7)

A non-alkali glass substrate was cleaned using a rotating nylon-haired brush while spraying a glass cleaner solution conditioned at 25° C. by a shower for 20 seconds. After showered with purified water, the substrate was sprayed with a silane coupling solution (0.3% aqueous solution of N-β-(aminoethyl)-γ-aminopropyl trimethoxysilane, trade name: KBM-603, Shin-Etsu Chemical Co., Ltd.) by a shower for 20 seconds, and then cleaned with a shower of purified water. The obtained substrate was then heated in a substrate preheating heater at 100° C. for 2 minutes.

The photosensitive polymer transfer material of Example 1, after being separated from its protective film, was laminated onto the substrate preheated at 100° C. for 2 minutes, using a laminator (product of Hitachi Industries Co., Ltd. (model Lamic II)) under a rubber roller temperature of 130° C., a line pressure of 100 N/cm, and a travel speed of 2.2 m/min.

After the protective film was separated from the photosensitive polymer layer, the entire surface of the layer was subjected to light exposure using a proximity-type exposure apparatus having an extra-high-voltage mercury lamp (product of Hitachi Electronics Engineering Co., Ltd.) under an exposure energy of 70 $mJ/cm^2$. Next, shower development was carried out using a triethanolamine-base developing solution (containing 2.5% of triethanolamine, a nonionic surfactant, and a polypropylene-base defoaming agent, trade name: T-PD1, product of Fuji Photo Film Co., Ltd.) at 30° C. for 50 seconds, under a flat nozzle pressure of 0.04 MPa, to thereby remove the thermoplastic polymer layer and the oxygen shut-off film.

Using thus obtained substrate, VA-LCD of Example 7, a embodiment shown in FIG. 3(a), was produced in a similar manner to that of Examples 6, except that colored photosensitive polymer transfer materials having no optically anisotropic layers were used instead of the transfer materials having optically anisotropic layers.

(Production of VA-LCD of Reference Example 6)

A VA-LCD of Reference Example 6 was produced in a similar manner to that of Example 7, except that the transfer material of Reference example 1 was used instead of the transfer material of Example 1.

(Production of VA-LCD of Comparative Example 1)

A VA-LCD of Comparative Example 1 was produced in a similar manner to that of Example 7, except that the transfer material did not have the optically anisotropic layer, and a 2.75-μm-thick optically anisotropic layer was formed on the protective film on the liquid crystal cell side of the lower polarizer plate, using AL-1 and LC-G1 in a similar manner to that of the formation of the G-1 optically anisotropic layer.

(Evaluation of VA-LCD)

Figure 4:
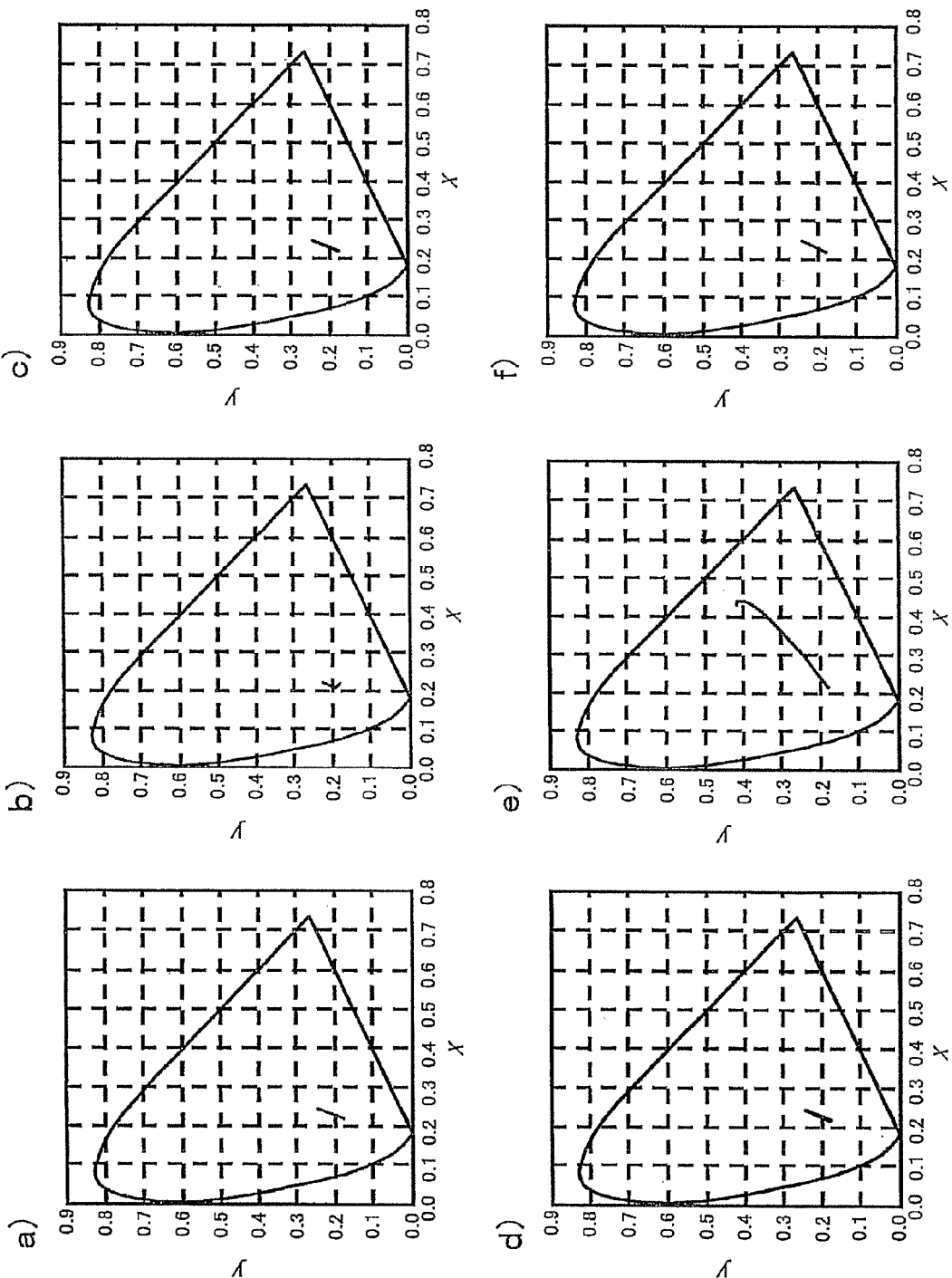
FIGS. 4(a) to 4(c) are drawings showing viewing angle dependence of color of a VA-LCD produced in Example 6.
FIGS. 4(d) to 4(f) are drawings showing viewing angle dependence of color of a VA-LCD produced in Comparative example 1.

Viewing angle characteristics of thus-produced liquid crystal display devices were measured using a viewing angle measuring instrument (EZ Contrast 160D, from ELDIM). Color changes observed for Example 6 and Comparative Example 1 in a black state (under no applied voltage) while varying viewing angle by 0 to 80° in the rightward direction from the front, in 45° upper-rightward direction, and in the upward direction, expressed on the xy chromaticity diagram were shown in FIG. 4. Results of visual observation in particular in 45° upper-rightward direction were shown in Table 4.

Further, VA-LCDs of Examples 6 and 7, Reference examples 5 and 6, and Comparative Example 1 were visually evaluated after the devices were allowed to stand in a condition of 40° C., 80% RH for 24 hours. Results are shown in Table 5.

TABLE 4

| Sample | Results of Visual Observation |
| --- | --- |
| Example 6 | Good viewing angle dependence of color, showing almost non-sensible color shift in the black state. |
| Comparative Example 1 | Coloring was observed in the oblique directions, while viewing angle dependence of contrast was kept at a level equivalent to that of Example 5. |

TABLE 5

| Sample | Results of Visual Observation |
| --- | --- |
| Example 6 | No degradation was observed in visual quality of display. |
| Example 7 | No degradation was observed in visual quality of display. |
| Reference Example 5 | Light leakage caused by defective patterning was slightly observed at the corners of pixels. |
| Reference Example 6 | Light leakage was observed, which is considered to be caused by defective delamination of the protective film or defects of the delamination in the shower development. |
| Comparative Example 1 | Light leakage of corner non-uniformities was observed at the corners of the screen. |

(Formation of Pixels with Transfer Material for IPS-Mode Displays)

G pixels were formed on the surface-processed glass substrate using the transfer material for IPS-mode displays in Example 5, in a similar manner to the transfer of the transfer material G-1. Thus-formed pixels observed under a polarizing microscope were found to show retardation.

Industrial Applicability

By using the transfer material of the present invention, a liquid crystal display device comprising an optically anisotropic layer having an optically compensation ability inside of a liquid crystal cell can be produced, with hardly increasing the number of steps for producing a liquid crystal display device. Particularly, a liquid crystal display device with no or reduced corner non-uniformities, which arise as the size of the device becomes bigger, can be provided. By using the photosensitive polymer layer of the transfer material of the present invention for the formation of a color filter, retardation of a liquid crystal cell can be optically compensated with respect to each color. The liquid crystal display device of the present invention which is produced by using the transfer material of the present invention has improved viewing angle characteristics, in particular, has less viewing angle dependence of color, and has no or reduced corner non-uniformities.

CROSS-REFERENCE TO RELATED APPLICATIONS

This application claims benefit of priority under 35 USC 119 to Japanese Patent Application No. 2005-260340 filed on Sep. 8, 2005.

The invention claimed is:

1. A process for producing a liquid crystal cell substrate, which comprises the following steps [1] to [4] in this order:
   [1] laminating a transfer material on a substrate;
   [2] separating the support from the transfer material laminated on the substrate; and
   [3] exposing the photosensitive polymer layer disposed on the substrate to light; and
   [4] removing unnecessary parts of the photosensitive polymer layer and the optically anisotropic layer on the substrate,
   wherein said transfer material comprises at least one optically anisotropic layer and at least one photosensitive polymer layer on at least one support,
   said optically anisotropic layer comprises one or more compounds having a reactive group,
   said photosensitive polymer layer comprises two or more types of photopolymerization initiators having different photoreaction mechanisms to each other, and a compound having a reactive group which can react with one or more of the reactive groups present in the optically anisotropic layer by the action of at least one of said photopolymerization initiators, and
   the at least one optically anisotropic layer is arranged between the at least one support and the at least one photosensitive polymer layer.

2. A process for producing a liquid crystal cell substrate, which comprises the following steps [1] to [3] in this order:
   [1] laminating a transfer material on a substrate;
   [2] separating the support from the transfer material laminated on the substrate; and
   [3] exposing the photosensitive polymer layer disposed on the substrate to light,
   wherein said transfer material comprises at least one optically anisotropic layer and at least one photosensitive polymer layer on at least one support,
   said optically anisotropic layer comprises one or more compounds having a reactive group,
   said photosensitive polymer layer comprises two or more types of photopolymerization initiators having different photoreaction mechanisms to each other, and a compound having a reactive group which can react with one or more of the reactive groups present in the optically anisotropic layer by the action of at least one of said photopolymerization initiators, and
   the at least one optically anisotropic layer is arranged between the at least one support and the at least one photosensitive polymer layer.

3. A liquid crystal cell substrate produced by the process according to claim 2.

4. A liquid crystal display device comprising the liquid crystal cell substrate according to claim 3.

5. The liquid crystal display device according to claim 4, employing a VA or IPS mode as a liquid crystal mode.

6. The process according to claim 2, wherein the optically anisotropic layer is a layer formed by coating with a solution comprising a liquid crystalline compound having a reactive group, and drying of the solution to thereby form a liquid crystal phase, and then applying heat or irradiating ionized radiation to the liquid crystal phase.

7. The process according to claim 6, wherein the ionized radiation is polarized ultraviolet radiation.

8. The process according to claim 6, wherein the liquid crystalline compound having a reactive group is a compound having an ethylenic unsaturated group.

9. The process according to claim 6, wherein the liquid crystalline compound is a rod-like liquid crystalline compound.

10. The process according to claim 6, wherein the liquid crystal phase is a cholesteric phase.

11. The process according to claim 2, wherein the optically anisotropic layer is formed of a composition comprising a radical polymerization initiator.

12. The process according to claim 2, wherein at least one of the photopolymerization initiators is a radical polymerization initiator.

13. The process according to claim 2, wherein at least one of the photopolymerization initiators is a cationic polymerization initiator.

14. The process according to claim 2, wherein the optically anisotropic layer comprises one or more of compounds having one or more groups selected from the group consisting of carboxy, hydroxy, amino, and thiol, and the photosensitive polymer layer comprises one or more compounds having epoxy group.

15. The process according to claim 2, wherein the optically anisotropic layer comprises one or more of compounds having epoxy group, and the photosensitive polymer layer comprises one or more compounds having one or more groups selected from the group consisting of carboxy, hydroxy, amino, and thiol.

16. The process according to claim 2, wherein the optically anisotropic layer is formed directly on the support or directly on a rubbed surface of an alignment layer formed on the support.

17. The process according to claim 2, wherein a frontal retardation (Re) value of the optically anisotropic layer is not zero, and the optically anisotropic layer gives substantially equal retardation values for light of a wavelength A nm coming respectively in a direction rotated by +40° and in a direction rotated by −40° with respect to a normal direction of a layer plane using an in-plane slow axis as a tilt axis (a rotation axis).

18. The process according to claim 2, wherein the optically anisotropic layer has a frontal retardation (Re) value of 60 to 200 nm, and gives a retardation of 50 to 250 nm for light of a wavelength λ nm coming in a direction rotated by +40° with respect to a normal direction of a layer plane using an in-plane slow axis as a tilt axis (a rotation axis).

19. The process according to claim 2, wherein the photosensitive polymer layer comprises a dye or a pigment.

* * * * *